United States Patent
Macpherson et al.

(10) Patent No.: US 7,268,006 B2
(45) Date of Patent: Sep. 11, 2007

(54) ELECTRONIC DEVICE INCLUDING A GUEST MATERIAL WITHIN A LAYER AND A PROCESS FOR FORMING THE SAME

(75) Inventors: Charles Douglas Macpherson, Santa Barbara, CA (US); Gordana Srdanov, Santa Barbara, CA (US); Matthew Stainer, Goleta, CA (US); Gang Yu, Santa Barbara, CA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 11/026,732

(22) Filed: Dec. 30, 2004

(65) Prior Publication Data

US 2006/0145167 A1    Jul. 6, 2006

(51) Int. Cl.
*H01L 21/20* (2006.01)
(52) U.S. Cl. .......................... 438/22; 438/57; 438/438; 257/E51.022
(58) Field of Classification Search ................. 438/22, 438/57, 99; 427/255.14, 447, 255.6; 257/40, 257/88, E51.022
See application file for complete search history.

(56) References Cited

U.S. PATENT DOCUMENTS

| | | | |
|---|---|---|---|
| 4,356,429 A | 10/1982 | Tang | |
| 4,539,507 A | 9/1985 | VanSlyke et al. | |
| 5,247,190 A | 9/1993 | Friend et al. | |
| 5,317,169 A | 5/1994 | Nakano et al. | |
| 5,408,109 A | 4/1995 | Heeger et al. | |
| 6,048,573 A | 4/2000 | Tang et al. | |
| 6,066,357 A | 5/2000 | Tang et al. | |
| 6,087,196 A | 7/2000 | Sturm et al. | |
| 6,366,016 B1 | 4/2002 | Sakaguchi et al. | |
| 6,440,877 B1 | 8/2002 | Yamazaki et al. | |
| 6,459,199 B1 | 10/2002 | Kido et al. | |
| 6,566,153 B1 | 5/2003 | Yang | |

(Continued)

FOREIGN PATENT DOCUMENTS

DE    199 18 193 A1    11/1999

(Continued)

OTHER PUBLICATIONS

U.S. Appl. No. 11/027,133, filed Dec. 30, 2004, MacPherson et al.

(Continued)

*Primary Examiner*—Savitri Mulpuri
(74) *Attorney, Agent, or Firm*—John H. Lamming

(57) ABSTRACT

A process for forming an electronic device includes forming a first layer over a substrate and placing a first liquid composition over a first portion of the first layer. The first liquid composition includes at least a first guest material and a first liquid medium. The first liquid composition comes in contact with the first layer and a substantial amount of the first guest material intermixes with the first layer. An electronic device includes a substrate and a continuous first layer overlying the substrate. The continuous layer includes a first portion in which an electronic component lies and a second portion where no electronic component lies. The first portion is at least 30 nm thick and includes a first guest material, and the second portion is no more than 40 nm thick.

15 Claims, 7 Drawing Sheets

U.S. PATENT DOCUMENTS

| | | |
|---|---|---|
| 6,575,800 B1 | 6/2003 | Kobayashi et al. |
| 6,576,975 B2 | 6/2003 | Yang |
| 6,633,121 B2 | 10/2003 | Eida et al. |
| 6,656,519 B2 | 12/2003 | Sakaguchi et al. |
| 6,737,800 B1 | 5/2004 | Winters et al. |
| 6,750,792 B2 | 6/2004 | Azami et al. |
| 6,888,307 B2 | 5/2005 | Silvernail et al. |
| 6,891,326 B2 | 5/2005 | Lu |
| 2001/0001050 A1 | 5/2001 | Miyashita et al. |
| 2001/0019782 A1 | 9/2001 | Igarashi et al. |
| 2002/0121638 A1 | 9/2002 | Grushin et al. |
| 2002/0197394 A1 | 12/2002 | Yamazaki et al. |
| 2003/0141810 A1 | 7/2003 | Kobayashi et al. |
| 2004/0094768 A1 | 5/2004 | Yu et al. |
| 2005/0100657 A1 | 5/2005 | MacPherson et al. |
| 2005/0100658 A1 | 5/2005 | MacPherson et al. |
| 2005/0236614 A1* | 10/2005 | Parker .................. 257/40 |

FOREIGN PATENT DOCUMENTS

| | | |
|---|---|---|
| EP | 0 989 778 A1 | 3/2000 |
| EP | 0 756 932 B1 | 11/2001 |
| EP | 1 191 612 A2 | 3/2002 |
| EP | 1 191 614 A2 | 3/2002 |
| EP | 0 880 303 B1 | 1/2004 |
| EP | 0 892 028 B1 | 2/2004 |
| WO | WO99/21233 | 4/1999 |
| WO | WO 00/12226 | 3/2000 |
| WO | WO 02/02714 A2 | 1/2002 |
| WO | WO 02/15645 A1 | 2/2002 |
| WO | WO 02/31896 A2 | 4/2002 |
| WO | WO 2004023574 A1 | 3/2004 |

OTHER PUBLICATIONS

C. David Muller et al., Multi-color organic light-emitting displays by solution processing, Nature, vol. 421:829-833, 2003.

Charlie Macpherson et al., 39.4: Development of Full Color Passive PLED Displays by Inkjet Printing, SID 03 Digest, vol. XXXIV, May 30, 2003, pp. 1191-1193.

* cited by examiner

ELECTRONIC DEVICE INCLUDING A GUEST MATERIAL WITHIN A LAYER AND A PROCESS FOR FORMING THE SAME

BACKGROUND OF THE INVENTION

1. Field of the Invention

The invention relates generally to electronic devices and processes for forming the same, and more specifically, to electronic devices including one or more guest materials within a layer and processes for forming the same.

2. Description of the Related Art

Electronic devices, including organic electronic devices, continue to be more extensively used in everyday life. Examples of organic electronic device include Organic Light-Emitting Diodes ("OLEDs"). Current research in the production of full color OLEDs is directed toward the development of cost effective, high throughput processes for producing color pixels. For the manufacture of monochromatic displays, spin-coating processes have been widely adopted. However, manufacture of full color displays usually requires certain modifications to procedures used in manufacture of monochromatic displays. For example, to make a display with full color images, each display pixel is divided into three subpixels, each emitting one of the three primary colors: red, green, and blue. This division of full-color pixels into three subpixels has resulted in a need to modify current processes for depositing different organic polymeric materials onto a single substrate during the manufacture of OLED displays.

One such process for depositing organic material layers on a substrate is ink-jet printing. Referring to FIG. 1, first electrodes 120 (e.g., anodes) are formed over a substrate 100. In addition, in order to form pixels and subpixels, a well structure 130 is formed on the substrate 100 to confine the ink drops to certain locations on the substrate 100. The well structure 130 typically is 1 to 5 microns thick and is made of an electrical insulator. A charge-transport layer 140 (e.g., a hole-transport layer) and organic active layer 150 may be formed by sequentially ink-jet printing each of the layers 140 and 150 over the first electrodes 120.

One or more guest materials may or may not be mixed with the organic active layer 150. For example, the organic active layer 150 within openings of the well structure 130 closest to the left-hand side of FIG. 1 may include a red guest material, and the organic active layer 150 within openings of the well structure 130 near the center of FIG. 1 may include a green guest material, and the organic active layer 150 within openings of the well structure 130 closest to the right-hand side of FIG. 1 may include a blue guest material. The well structure 130 tends to reduce the aperture ratio of a display, and therefore, higher current is needed to achieve sufficient emission intensity as seen by a user of the display.

In an alternative process, the charge-transport layer 140 and organic active layer 150 may be formed with or without a well structure. Inks with different guest materials may be placed on regions of the organic active layer 150. The inks may include a conjugated polymer. After the ink is placed on the organic active layer 150, a diffusion step is performed to drive guest material from the overlying polymer into the organic active layer 150. A second electrode (not illustrated) is formed over the organic active layer 150 and the ink.

Many problems occur when using this process for organic electronic devices formed by such processes. First, most of the guest material does not diffuse into the organic active layer 150. Typically, 25% or less of the guest material from the ink is diffused into the organic active layer 150. Therefore most of the guest material lies outside the organic active layer 150.

Second, the electronic components formed using this ink diffusion process have poor efficiency. As a basis for comparison, the same host material (as the organic active layer 150) and guest material may be mixed before the organic active layer is formed over the substrate. The combination of the host material and guest material may be spin coated and subsequently processed to form an electronic component. The spin-coated electronic component will be referred to as a corresponding conventional electronic component because the organic active layer has the same host material and guest material as the diffused component. Electronic components formed by the ink diffusion process have efficiencies that are lower than their corresponding conventional electronic components. Due to lower efficiency, the electronic components formed using the ink diffusion process have intensities too low to be used for commercially-sold displays.

Third, this ink diffusion process causes a very non-uniform distribution of guest material concentration, resulting in a high concentration gradient (change in concentration divided by distance) between electrodes with an electronic device. The guest material concentration within the organic active layer 150 near the second electrode is typically at least two and usually several orders of magnitude higher than the guest material concentration within the organic active layer 150 near the first electrodes 120. The high guest material concentration gradient makes the display nearly impossible to use, particularly over time. As the potential difference between the first and second electrodes are changed, the location for recombination of electrons and holes within the organic active layer 150 also changes, moving closer to or further from first electrodes 120 (depending on the relative change in potential difference). When the recombination is closer to the second electrode, more guest material is present at the recombination location. When the recombination is closer to the first electrode 120, less guest material is present at the recombination location.

This guest material concentration gradient in the organic active layer 150 causes a different spectrum to be emitted from the electronic component as the potential difference between the first and second electrodes changes. Note that higher intensity is typically achieved by increasing the current, which in turn typically occurs by increasing the potential difference between the first and second electrodes. Therefore, intensity control of a single color (i.e., "gray-scale") is difficult because the emission spectrum shifts with a change in intensity, both of which are caused by a change in the potential difference between the first and second electrodes.

As a component ages, the amount of current needed for the same intensity typically increases. If the host material is capable of emitting blue light, as the intensity decays over time and current is increased (to try to keep intensity relatively constant over time), the emission of red and green doped pixels may become more blue with respect to their initial characteristic emission. As the component ages the operating voltage is increased to maintain constant luminance. If the guest material concentration profile in the host material is not sufficiently uniform, then as the operating voltage is increased to offset luminance decay, the emission spectrum of the red and green pixels may begin to include a blue component as a result of changes in the recombination zone position and width within the emissive layer.

Fourth, the ink diffusion process is nearly impossible to use in manufacturing because of the sensitivity to thickness of the organic active layer 150. Relatively small changes in thickness can have a large impact on the guest material concentration profile within the organic active layer 150. For displays, a user will observe variation from display to display, or even within the array of a single display, due to variation in the thickness of the organic active layer 150 during the fabrication process.

A different conventional process uses a vapor or solid phase diffusion process. Both processes suffer from similar problems previously described. If the diffusion is long enough to make the concentration of a guest material more uniform throughout a thickness of the layer (i.e., reduce the concentration gradient between the electrodes), lateral diffusion will be too large and can result in low resolution because the pixels will need to be large. Alternatively, if lateral diffusion can be kept at an acceptable level for high resolution, the guest material concentration gradient throughout the thickness of the organic layer may be unacceptably large. In some instances, both problems may occur (i.e., unacceptably large laterally diffusion while having too severe of a concentration gradient between the electrodes of the electronic device).

SUMMARY OF THE INVENTION

A process for forming an electronic device includes forming a first layer over a substrate and placing a first liquid composition over a first portion of the first layer. The first liquid composition includes at least a first guest material and a first liquid medium. The first liquid composition comes in contact with the first layer and a substantial amount of the first guest material intermixes with the first layer.

An electronic device includes a substrate and a continuous first layer overlying the substrate. The continuous layer includes a first portion in which an electronic component lies and a second portion where no electronic component lies. The first portion is at least 30 nm thick and includes a first guest material, and the second portion is no more than 40 nm thick.

The foregoing general description and the following detailed description are exemplary and explanatory only and are not restrictive of the invention, as defined in the appended claims.

BRIEF DESCRIPTION OF THE FIGURES

The invention is illustrated by way of example and not limitation in the accompanying figures.

Figure 1:
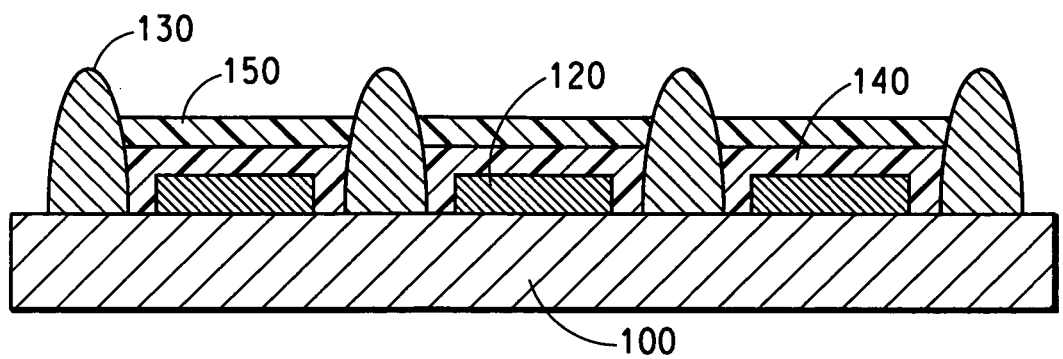
FIG. 1 includes an illustration of a cross-sectional view of a portion of a substrate, first electrodes, a well structure, a charge-transport layer, and an organic active layer lying between the openings in the well structure. (Prior art)

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

A process for forming an electronic device includes forming a first layer over a substrate and placing a first liquid composition over a first portion of the first layer. The first liquid composition includes at least a first guest material and a first liquid medium. The first liquid composition comes in contact with the first layer and a substantial amount of the first guest material intermixes with the first layer.

In one embodiment, the first layer is (1) capable of emitting radiation having an emission maximum at a targeted wavelength or within a targeted spectrum of wavelengths or (2) designed to respond to radiation at the targeted wavelength or within the targeted spectrum of wavelengths, wherein the targeted spectrum has a width no greater than 150 nm. The first guest material is (1) capable of emitting radiation having an emission maximum at the targeted wavelength or a targeted spectrum of wavelengths or (2) designed to respond to radiation at the targeted wavelength or within the targeted spectrum of wavelengths. In a specific embodiment, each of the first layer and the first guest material has an emission maximum within a blue light spectrum.

In another embodiment, the process further includes forming a second layer over the substrate before forming the first layer, and densifying at least part of the second layer. The first layer is formed over the second layer after densifying. In a specific embodiment, the first and second layers have substantially a same composition. In another specific embodiment, the second layer substantially prevents the first guest material from intermixing with the substrate. In still another specific embodiment, densifying includes cross-linking the second layer. In a more specific embodiment, the process further includes cross-linking the first layer, wherein the first layer includes a first material; the second layer includes a second material. Cross-linking the first layer is performed such that some, but not all, of the first material is cross-linked, and cross-linking the second material is performed at least until substantially all of the second material is cross-linked.

In still another embodiment, the process further includes placing a second liquid composition over a second portion of the first layer. The second liquid composition includes at least a second guest material and a second liquid medium. The second guest material is different from the first guest material, and the second liquid composition comes in contact with the first layer and a substantial amount of the second guest material intermixes with the first layer. The process also includes placing a third liquid composition over a third portion of the first layer. The third liquid composition includes at least a third guest material and a third liquid medium, wherein the third guest material is different from each of the first and second guest materials. The third liquid composition comes in contact with the first layer and a substantial amount of the third guest material intermixes with the first layer. In a specific embodiment, the first layer, as formed, has a thickness no greater than 40 nm. A first combination of the first layer and the first guest material has a thickness of at least 60 nm, a second combination of the first layer and the second guest material has a thickness of at least 30 nm, and a third combination of the first layer and the third guest material has a thickness of at least 60 nm.

In one embodiment, substantially all of the first guest material intermixes with the first layer. In another embodiment, placing the first liquid composition over the first layer is performed using a precision deposition technique. In still another embodiment, forming the first layer includes forming a continuous layer. In a further embodiment, the first layer is at least part of a filter layer. In yet a further embodiment, an electronic device formed by the process. In the electronic device the first guest material within the first layer is part of a radiation-emitting electronic component or a radiation-responsive electronic component.

An electronic device includes a substrate and a continuous first layer overlying the substrate. The continuous layer includes a first portion in which an electronic component lies and a second portion where no electronic component lies. The first portion is at least 30 nm thick and includes a first guest material, and the second portion is no more than 40 nm thick.

In one embodiment, the continuous first layer includes additional first portions, and the electronic device includes first electronic components. Each of the first electronic components includes a first electrode, a second electrode, and at least one of the first portions lying between the first and second electrodes. In a specific embodiment, the continuous first layer includes third portions and fourth portions. The third portions are at least 30 nm thick and include a second guest material, and the fourth portions are at least 30 nm thick and include a third guest material. The electronic device includes second electronic components and third electronic components. Each of the second electronic components includes a third electrode, a fourth electrode, and at least one of the second portions lying between the third and fourth electrodes. Each of the third electronic components includes a fifth electrode, a sixth electrode, and at least one of the third portions lying between the fifth and sixth electrodes. In a more specific embodiment, the first electronic component is a radiation-emitting electronic component or a radiation-responsive electronic component.

In another embodiment, the continuous first layer is (1) capable of emitting radiation having an emission maximum at a targeted wavelength or within a targeted spectrum of wavelengths or (2) designed to respond to radiation at the targeted wavelength or within the targeted spectrum of wavelengths, wherein the targeted spectrum has a width no greater than 150 nm. The first guest material is (1) capable of emitting radiation having an emission maximum at the targeted wavelength or a targeted spectrum of wavelengths or (2) designed to respond to radiation at the targeted wavelength or within the targeted spectrum of wavelengths. In a specific embodiment each of the continuous first layer and the first guest material has an emission maximum within a blue light spectrum.

In a further embodiment, the electronic device further includes a second layer lying between the substrate and the continuous first layer. The continuous first layer includes a first material, wherein some, but not all, of the first material is cross-linked. The second layer includes a second material, wherein substantially all of the second material is cross-linked. In yet a further embodiment, the continuous first layer is at least part of a filter layer.

Other features and advantages of the invention will be apparent from the following detailed description, and from the claims. The detailed description first addresses Definitions and Clarification of Terms followed by Intermixing Using Liquid Compositions, Liquid Compositions, Fabrication Before Introduction of Liquid Composition(s), Introduction of Liquid Composition(s), Remainder of Fabrication, Alternative Embodiments, Electronic Operation of the Electronic Device, Advantages, and finally Examples.

1. Definitions and Clarification of Terms

Before addressing details of embodiments described below, some terms are defined or clarified. The terms "array," "peripheral circuitry" and "remote circuitry" are intended to mean different areas or components of the electronic device. For example, an array may include pixels, cells, or other structures within an orderly arrangement (usually designated by columns and rows). The pixels, cells, or other structures within the array may be controlled locally by peripheral circuitry, which may lie within the same electronic device as the array but outside the array itself. Remote circuitry typically lies away from the peripheral circuitry and can send signals to or receive signals from the array (typically via the peripheral circuitry). The remote circuitry may also perform functions unrelated to the array. The remote circuitry may or may not reside on the substrate having the array.

The term "blue light" is intended to mean radiation that has an emission maximum at a wavelength in a range of approximately 400 to 500 nm.

The term "buffer layer" or "buffer material" is intended to mean one or more electrically conductive or semiconductive materials and may have one or more functions in an electronic device, including planarization of the underlying layer, a charge transport or charge injection property, scavenging of one or more impurities, such as oxygen or metal ions, or another aspect to facilitate or to improve the performance of the electronic device. A buffer material may be a polymer, a solution, a dispersion, a suspension, an emulsion, a colloidal mixture, another composition, or any combination thereof.

The term "charge-blocking," when referring to a layer, material, member, or structure, is intended to mean such layer, material, member or structure significantly reduces the likelihood that a charge intermixes with another layer, material, member or structure.

The term "charge-injecting," when referring to a layer, material, member, or structure, is intended to mean such layer, material, member or structure promotes charge migration into an adjacent layer, material, member or structure.

The term "charge-transport," when referring to a layer, material, member or structure, is intended to mean such layer, material, member or structure facilitates migration of such charge through the thickness of such layer, material, member or structure with relative efficiency and small loss of charge.

The term "continuous," when referring to a layer, is intended to mean a layer that covers an entire substrate or portion of a substrate (e.g., the array) without any breaks in the layer. Note that a continuous layer may have a portion that is locally thinner than another portion and still be continuous if there is no break or gap in the layer.

The term "cross-linking" is intended to mean forming bonds that connect two adjacent chains of atoms in a complex molecule.

The term "densifying," when referring to a layer, member, or structure, is intended to mean rendering the layer, member, or structure into a state in which such layer, member, or structure is less susceptible to interactions with one or more materials that contacts or is otherwise exposed to such layer, member, or structure. Densification can include annealing, cross-linking or other polymerization, curing, passivating (reducing the number of dangling bonds), or any combination thereof.

The term "electronic component" is intended to mean a lowest level unit of a circuit that performs an electrical or electro-radiative (e.g., electro-optic) function. An electronic component may include a transistor, a diode, a resistor, a capacitor, an inductor, a semiconductor laser, an optical switch, or the like. An electronic component does not include parasitic resistance (e.g., resistance of a wire) or parasitic capacitance (e.g., capacitive coupling between two conductors connected to different electronic components where a capacitor between the conductors is unintended or incidental).

The term "electronic device" is intended to mean a collection of circuits, electronic components, or combinations thereof that collectively, when properly connected and supplied with the appropriate potential(s), performs a function. An electronic device may include or be part of a system. An example of an electronic device includes a display, a sensor array, a computer system, an avionics system, an automobile, a cellular phone, or other consumer or industrial electronic product.

The term "emission maximum" is intended to mean the highest intensity of radiation emitted. The emission maximum has a corresponding wavelength or spectrum of wavelengths (e.g. red light, green light, or blue light).

The term "filter," when referring to a layer, material, member or structure, is intended to mean a layer, material, member, or structure separate from a radiation-emitting or radiation-responsive layer, wherein the filter is used to limit the wavelength(s) of radiation transmitted through such layer, material, member, or structure. For example, a red filter layer may allow substantially only red light from the visible light spectrum to pass through the red filter layer. Therefore, the red filter layer filters out green light and blue light.

The term "green light" is intended to mean radiation that has an emission maximum at a wavelength in a range of approximately 500 to 600 nm.

The term "guest material" is intended to mean a material, within a layer including a host material, that changes the electronic characteristic(s) or the targeted wavelength of radiation emission, reception, or filtering of the layer compared to the electronic characteristic(s) or the wavelength of radiation emission, reception, or filtering of the layer in the absence of such material.

The term "host material" is intended to mean a material, usually in the form of a layer, to which a guest material may be added. The host material may or may not have electronic characteristic(s) or the ability to emit, receive, or filter radiation.

The term "intermix" and its variants are intended to be broadly construed as mixing a material with a layer, member, structure, or another material without the use of an external electrical field, and covers agitation, dissolution, diffusion, emulsifying, suspending (for a suspension), or a combination thereof. The material may enter the layer, member, structure, or the other material; the layer, member, structure, or other material may enter the material; or combination thereof. Therefore, the "direction" of movement is irrelevant to intermixing. Intermixing does not require achieving a homogeneous or substantially uniform concentration of the material within the layer, member, structure, or other material. Intermixing does not include ion implantation.

The term "liquid composition" is intended to mean an organic active material that is dissolved in a liquid medium to form a solution, dispersed in a liquid medium to form a dispersion, or suspended in a liquid medium to form a suspension or an emulsion.

The term "liquid medium" is intended to mean a liquid within a solution, dispersion, suspension, or emulsion. Liquid medium is used regardless whether one or more solvents are present, and therefore, liquid medium is used as the singular or plural form (i.e., liquid media) of the term.

The term "organic active layer" is intended to mean one or more organic layers, wherein at least one of the organic layers, by itself or when in contact with a dissimilar material, is capable of forming a rectifying junction.

The term "precision deposition technique" is intended to mean a deposition technique that is capable of depositing one or more materials over a substrate to a thickness no greater than approximately one millimeter. A stencil mask, frame, well structure, patterned layer or other structure(s) may be present during such deposition. Non-limiting examples of such techniques include screen printing, ink-jet printing, solution dispense, needle aspiration, selective printing, and combinations thereof.

The term "radiation-emitting component" is intended to mean an electronic component, which when properly biased, emits radiation at a targeted wavelength or spectrum of wavelengths. The radiation may be within the visible-light spectrum or outside the visible-light spectrum (ultraviolet ("UV") or infrared ("IR")). A light-emitting diode is an example of a radiation-emitting component.

The term "radiation-responsive component" is intended to mean an electronic component can sense or respond to radiation at a targeted wavelength or spectrum of wavelengths. The radiation may be within the visible-light spectrum or outside the visible-light spectrum (UV or IR). Photodetectors, IR sensors, biosensors, and photovoltaic cells are examples of radiation-responsive components.

The term "rectifying junction" is intended to mean a junction within a semiconductor layer or a junction formed by an interface between a semiconductor layer and a dissimilar material in which charge carriers of one type flow easier in one direction through the junction compare to the opposition direction. A pn junction is an example of a rectifying junction that can be used as a diode.

The term "red light" is intended to mean radiation that has an emission maximum at a wavelength in a range of approximately 600-700 nm.

The phrase "spectrum" is intended to mean more than one wavelength. Spectrum can correspond to one or more ranges of wavelengths. The ranges can be contiguous, overlapping, spaced apart, or any combination thereof.

The term "substantial amount" is intended to mean, on a mass basis, at least one third of an original amount. For example, when a substantial amount of a guest material lies within an organic layer, at least one third of the guest material in a volume of a stream or drop (original amount of guest material) that is placed over the organic layer lies within that organic layer.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise. Group numbers corresponding to columns within the periodic table of the elements use the "New Notation" convention as seen in the *CRC Handbook of Chemistry and Physics*, 81$^{st}$ Edition (2000).

Unless otherwise defined, all technical and scientific terms used herein have the same meaning as commonly understood by one of ordinary skill in the art to which this invention belongs. Although suitable methods and materials are described herein for embodiments of the invention, or methods for making or using the same, other methods and materials similar or equivalent to those described can be used without departing from the scope of the invention. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the organic light-emitting diode display, photodetector, photovoltaic, and semiconductor arts.

2. Intermixing Using Liquid Compositions

The concepts as taught in this specification can be applied to electronic devices to form one or more layers in which a substantial amount of one or more guest materials is incorporated at least partially within a layer, which comprises at least one host material. The layer may or may not be an organic layer. In one embodiment, a substantial amount is at least approximately 40 percent, and in another embodiment, is at least approximately 50 percent. In still a further embodiment, substantially all of the one or more guest materials may be intermixed with a layer with which the liquid composition contacts. A well structure may or may not be present during the incorporation process. More specifically, one or more liquid compositions, including the one or more guest materials and a liquid medium, may be in the form of a solution, dispersion, emulsion, or suspension.

This paragraph includes a description of one interaction between an organic layer and the liquid composition. Note that the organic layer can be a layer overlying a substrate. Alternatively, the substrate may not be present or the organic layer is the substrate. Although the description in this paragraph refers to a liquid composition having one guest material to simplify understanding, more than one guest material may be used, and the principles for a dispersion, emulsion, or suspension are similar. Alternatively, the liquid composition may also include a host material, which is also present in the organic layer, in addition to one or more guest materials. The liquid composition may be placed over the precise area where the guest material is to intermix with the organic layer. The liquid medium of the liquid composition is capable of forming a solution, dispersion, emulsion, or suspension with the organic layer to convert the organic layer from a substantially solid state to a substantially liquid state in the form of such solution, dispersion, emulsion, or suspension. The organic layer has good miscibility characteristics with the liquid medium used for the liquid composition. As the liquid medium converts a localized region of the organic layer to a substantially liquid state, the guest material can intermix with the organic layer. Unexpectedly, most of the guest material intermixes with the organic layer. In one embodiment, substantially all of the guest material from the liquid composition intermixes with the organic layer. The guest material effects the radiation emitted from, responded to by, transmitted through, or electronic characteristics of the organic layer. The host material(s) for forming the organic layer vary based upon the application of the electronic device and the use of the organic layer within the electronic device. At least portion(s) of the organic layer may be used as a radiation-emitting organic active layer, a radiation-responsive organic active layer, a filter layer, or layer within an electronic component (e.g., at least part of a resistor, transistor, capacitor, etc.).

3. Liquid Compositions

A printing apparatus can be used to deposit a variety of different materials, including liquid compositions. The following paragraphs include only some but not all of the materials that may be used. In one embodiment, one or more materials for an organic or inorganic layer within an electronic device are formed using the printing apparatus.

A continuous printing apparatus, such as one as described in Ser. No. 11/027,133, entitled "Electronic Devices and Processes For Forming the Same" by MacPherson et al, filed simultaneously herewith, is well suited for printing liquid compositions. The printing apparatus allows a wider range of operating parameters and liquid compositions to be used compared to a conventional ink-jet printer. In one embodiment, one or more parameters can affect the flow characteristics of the liquid composition. Viscosity is a parameter that can affect the flow characteristics. The viscosity can be affected by selection of the liquid medium, the solids content within the liquid medium, temperature of the liquid composition, or potentially one or more other factors, or any combination thereof. Viscosity can be affected directly by temperature (viscosity of the liquid medium increases with decreasing temperature or decreases with increasing temperature) or indirectly by changing the evaporation rate of the liquid medium within the liquid composition (i.e., using liquid medium having lower or higher boiling points, changing the temperature of the liquid composition, or a combination thereof). After reading this specification, skilled artisans will appreciate that they have many different ways to allow a significantly larger selection of liquid medium, a larger range of solids concentration of the liquid composition to be used, or a combination thereof.

The liquid composition can be in the form of a solution, dispersion, emulsion, or suspension. In the paragraphs that follow, non-limiting examples of solid materials and liquid medium are given. The solid material(s) can be selected based upon the electronic or electro-radiative properties for a subsequently-formed layer. The liquid medium can be selected based on criteria described later in this specification.

When using the printing apparatus, the liquid composition may have solid(s) content greater than approximately 2.0 weight percent without having to worry about clogging. In one embodiment, the solid(s) content is in a range of approximately 2.0 to 3.0 weight percent. Further, the printing apparatus does not require precisely formed drops to be used. Therefore, the printing apparatus can use a liquid composition having a higher viscosity or lower boiling point compared to a conventional ink-jet printer. Further, the printing apparatus can use a liquid composition having a lower viscosity or higher boiling point compared to a conventional ink-jet printer. Additionally, the liquid medium within a liquid composition does not need to be degassed before printing. For example, a conventional ink-jet printer used for dispensing a conductive organic material within an aqueous solution requires the aqueous solvent to be degassed. However, because printing apparatus allows for more processing margin, degassing of a liquid medium is not required for the proper operation of the printing apparatus.

An organic layer printed using the printing apparatus can include an organic active layer, (e.g., a radiation-emitting organic active layer or a radiation-responsive organic active layer), filter layer, buffer layer, charge-injecting layer, charge-transport layer, charge-blocking layer, or any combination thereof. The organic layer may be used as part of a resistor, transistor, capacitor, diode, etc.

For a radiation-emitting organic active layer, suitable radiation-emitting materials include one or more small molecule materials, one or more polymeric materials, or a combination thereof. A small molecule material may include any one or more of those described in, for example, U.S. Pat. No. 4,356,429 ("Tang"); U.S. Pat. No. 4,539,507 ("Van Slyke"); U.S. Patent Application Publication No. US 2002/0121638 ("Grushin"); or U.S. Pat. No. 6,459,199 ("Kido"). Alternatively, a polymeric material may include any one or more of those described in U.S. Pat. No. 5,247,190 ("Friend"); U.S. Pat. No. 5,408,109 ("Heeger"); or U.S. Pat. No. 5,317,169 ("Nakano"). An exemplary material is a semiconducting conjugated polymer. An example of such a polymer includes poly(paraphenylenevinylene) (PPV), a PPV copolymer, a polyfluorene, a polyphenylene, a polyacetylene, a polyalkylthiophene, poly(n-vinylcarbazole) (PVK), or the like. In one specific embodiment, a radiation-emitting active layer without any guest material may emit blue light.

For a radiation-responsive organic active layer, a suitable radiation-responsive material may include many a conjugated polymer or an electroluminescent material. Such a material includes, for example, a conjugated polymer or an electro- and photo-luminescent material. A specific example includes poly(2-methoxy,5-(2-ethyl-hexyloxy)-1,4-phenylene vinylene) ("MEH-PPV") or a MEH-PPV composite with CN-PPV.

The location of a filter layer may be between an organic active layer and a user side of the electronic device. A filter layer may be part of a substrate, an electrode (e.g., an anode or a cathode), a charge-transport layer, a charge-injecting layer, a charge-blocking layer; the filter layer may lie between any one or more of the substrate, an electrode, charge-a transport layer, a charge-injecting layer, a charge-blocking layer, or any combination thereof; or any combination thereof. In another embodiment, the filter layer may be a layer that is fabricated separately (while not attached to the substrate) and later attached to the substrate at any time before, during, or after fabricating the electronic components within the electronic device. In this embodiment, the filter layer may lie between the substrate and a user of the electronic device.

When the filter layer is separate from or part of the substrate, or when the filter lies between the substrate and an electrode closest to the substrate, a suitable material includes an organic material including a polyolefin (e.g., polyethylene or polypropylene); a polyester (e.g., polyethylene terephthalate or polyethylene naphthalate); a polyimide; a polyamide; a polyacrylonitrile or a polymethacrylonitrile; a perfluorinated or partially fluorinated polymer (e.g., polytetrafluoroethylene or a copolymer of tetrafluoroethylene and polystyrene); a polycarbonate; a polyvinyl chloride; a polyurethane; a polyacrylic resin, including a homopolymer or a copolymer of an ester of an acrylic or methacrylic acid; an epoxy resin; a Novolac resin; or any combination thereof.

For a hole-injecting layer, hole-transport layer, electron-blocking layer, or any combination thereof, a suitable material includes polyaniline ("PANI"), poly(3,4-ethylenedioxythiophene) ("PEDOT"), polypyrrole, an organic charge transfer compound, such as tetrathiafulvalene tetracyanoquinodimethane ("TTF-TCQN"), a hole-transport material as described in Kido, or any combination thereof.

For an electron-injecting layer, electron transport layer, hole-blocking layer, or any combination thereof, a suitable material includes a metal-chelated oxinoid compound (e.g., $Alq_3$ or aluminum(III)bis(2-methyl-8-quinolinato)4-phenylphenolate ("BAlq")); a phenanthroline-based compound (e.g., 2,9-dimethyl-4,7-diphenyl-1,10-phenanthroline ("DDPA") or 9,10-diphenylanthracene ("DPA")); an azole compound (e.g., 2-tert-butylphenyl-5-biphenyl-1,3,4-oxadiazole ("PBD") or 3-(4-biphenyl)-4-phenyl-5-(4-t-butylphenyl)-1,2,4-triazole ("TAZ"); an electron transport material as described in Kido; a diphenylanthracene derivative; a dinaphthylanthracene derivative; 4,4-bis(2,2-diphenyl-ethen-1-yl)-biphenyl ("DPVBI"); 9,10-di-beta-naphthylanthracene; 9,10-di-(naphenthyl)anthracene; 9,10-di-(2-naphthyl)anthracene ("ADN"); 4,4'-bis(carbazol-9-yl) biphenyl ("CBP"); 9,10-bis-[4-(2,2-diphenylvinyl)-phenyl]-anthracene ("BDPVPA"); anthracene, N-arylbenzimidazoles (such as "TPBI"); 1,4-bis[2-(9-ethyl-3-carbazoyl)vinylenyl]benzene; 4,4'-bis[2-(9-ethyl-3-carbazoyl)vinylenyl]-1,1'-biphenyl; 9,10-bis[2,2-(9,9-fluorenylene)vinylenyl]anthracene; 1,4-bis[2,2-(9,9-fluorenylene) vinylenyl]benzene; 4,4'-bis[2,2-(9,9-fluorenylene) vinylenyl]-1,1'-biphenyl; perylene, substituted perylenes; tetra-tert-butylperylene ("TBPe"); bis(3,5-difluoro-2-(2-pyridyl)phenyl-(2-carboxypyridyl) iridium III ("F(Ir)Pic"); a pyrene, a substituted pyrene; a styrylamine; a fluorinated phenylene; oxidazole; 1,8-naphthalimide; a polyquinoline; one or more carbon nanotubes within PPV; or any combination thereof. For an electronic component, such as a resistor, transistor, capacitor, etc., the organic layer may include one or more of thiophenes (e.g., polythiophene, poly(alkylthiophene), alkylthiophene, bis (dithienthiophene), alkylanthradithiophene, etc.), polyacetylene, pentacene, phthalocyanine, or any combination thereof.

An examples of an organic dye includes 4-dicyanmethylene-2-methyl-6-(p-dimethyaminostyryl)-4H-pyran (DCM), coumarin, pyrene, perylene, rubrene, a derivative thereof, or any combination thereof.

An examples of an organometallic material includes a functionalized polymer comprising one or more functional groups coordinated to at least one metal. An exemplary functional group contemplated for use includes a carboxylic acid, a carboxylic acid salt, a sulfonic acid group, a sulfonic acid salt, a group having an OH moiety, an amine, an imine, a diimine, an N-oxide, a phosphine, a phosphine oxide, a β-dicarbonyl group, or any combination thereof. An exemplary metal contemplated for use includes a lanthanide metal (e.g., Eu, Tb), a Group 7 metal (e.g., Re), a Group 8 metal (e.g., Ru, Os), a Group 9 metal (e.g., Rh, Ir), a Group 10 metal (e.g., Pd, Pt), a Group 11 metal (e.g., Au), a Group 12 metal (e.g., Zn), a Group 13 metal (e.g., Al), or any combination thereof. Such an organometallic material includes a metal chelated oxinoid compound, such as tris(8-hydroxyquinolato)aluminum ($Alq_3$); a cyclometalated iridium or platinum electroluminescent compound, such as a complex of iridium with phenylpyridine, phenylquinoline, or phenylpyrimidine ligands as disclosed in published PCT Application WO 02/02714, an organometallic complex described in, for example, published applications US 2001/0019782, EP 1191612, WO 02/15645, WO 02/31896, and EP 1191614; or any mixture thereof.

An examples of a conjugated polymer includes a poly (phenylenevinylene), a polyfluorene, a poly(spirobifluorene), a copolymer thereof, or any combination thereof.

Selecting a liquid medium can also be an important factor for achieving one or more proper characteristics of the liquid composition. A factor to be considered when choosing a liquid medium includes, for example, viscosity of the resulting solution, emulsion, suspension, or dispersion, molecular weight of a polymeric material, solids loading, type of liquid medium, boiling point of the liquid medium, temperature of an underlying substrate, thickness of an organic layer that receives a guest material, or any combination thereof In some embodiments, the liquid medium includes at least one solvent. An exemplary organic solvent includes a halogenated solvent, a colloidal-forming polymeric acid, a hydrocarbon solvent, an aromatic hydrocarbon solvent, an ether solvent, a cyclic ether solvent, an alcohol solvent, a glycol solvent, a ketone solvent, a nitrile solvent, a sulfoxide solvent, an amide solvent, or any combination thereof.

An exemplary halogenated solvent includes carbon tetrachloride, methylene chloride, chloroform, tetrachloroethylene, chlorobenzene, bis(2-chloroethyl)ether, chloromethyl ethyl ether, chloromethyl methyl ether, 2-chloroethyl ethyl ether, 2-chloroethyl propyl ether, 2-chloroethyl methyl ether, or any combination thereof.

An exemplary colloidal-forming polymeric acid includes a fluorinated sulfonic acid (e.g., fluorinated alkylsulfonic acid, such as perfluorinated ethylenesulfonic acid) or any combinations thereof.

An exemplary hydrocarbon solvent includes pentane, hexane, cyclohexane, heptane, octane, decahydronaphthalene, a petroleum ether, ligroine, or any combination thereof.

An exemplary aromatic hydrocarbon solvent includes benzene, naphthalene, toluene, xylene, ethyl benzene, cumene (iso-propyl benzene) mesitylene (trimethyl benzene), ethyl toluene, butyl benzene, cymene (iso-propyl toluene), diethylbenzene, iso-butyl benzene, tetramethyl benzene, sec-butyl benzene, tert-butyl benzene, anisole, 4-methylanisole, 3,4-dimethylanisole, or any combination thereof.

An exemplary ether solvent includes diethyl ether, ethyl propyl ether, dipropyl ether, diisopropyl ether, dibutyl ether, methyl t-butyl ether, glyme, diglyme, benzyl methyl ether, isochroman, 2-phenylethyl methyl ether, n-butyl ethyl ether, 1,2-diethoxyethane, sec-butyl ether, diisobutyl ether, ethyl n-propyl ether, ethyl isopropyl ether, n-hexyl methyl ether, n-butyl methyl ether, methyl n-propyl ether, or any combination thereof.

An exemplary cyclic ether solvent includes tetrahydrofuran, dioxane, tetrahydropyran, 4 methyl-1,3-dioxane, 4-phenyl-1,3-dioxane, 1,3-dioxolane, 2-methyl-1,3-dioxolane, 1,4-dioxane, 1,3-dioxane, 2,5-dimethoxytetrahydrofuran 2,5-dimethoxy-2,5-dihydrofuran, or any combination thereof.

An exemplary alcohol solvent includes methanol, ethanol, 1-propanol, 2-propanol, 1-butanol, 2-butanol, 2-methyl-1-propanol (i.e., iso-butanol), 2-methyl-2-propanol (i.e., tert-butanol), 1-pentanol, 2-pentanol, 3-pentanol, 2,2-dimethyl-1-propanol, 1-hexanol, cyclopentanol, 3-methyl-1-butanol, 3-methyl-2-butanol, 2-methyl-1-butanol, 2,2-dimethyl-1-propanol, 3-hexanol, 2-hexanol, 4-methyl-2-pentanol, 2-methyl-1-pentanol, 2-ethylbutanol, 2,4-dimethyl-3-pentanol, 3-heptanol, 4-heptanol, 2-heptanol, 1-heptanol, 2-ethyl-1-hexanol, 2,6-dimethyl-4-heptanol, 2-methylcyclohexanol, 3-methylcyclohexanol, 4-methylcyclohexanol, or any combination thereof.

An alcohol ether solvent may also be employed. An exemplary alcohol ether solvent includes 1-methoxy-2-propanol, 2-methoxyethanol, 2-ethoxyethanol, 1-methoxy-2-butanol, ethylene glycol monoisopropyl ether, 1-ethoxy-2-propanol, 3-methoxy-1-butanol, ethylene glycol monoisobutyl ether, ethylene glycol mono-n-butyl ether, 3-methoxy-3-methylbutanol, ethylene glycol mono-tert-butyl ether, or any combination thereof.

An exemplary glycol solvent includes ethylene glycol, propylene glycol, propylene glycol monomethyl ether (PGME), dipropylene glycol monomethyl ether (DPGME), or any combination thereof.

An exemplary ketone solvent includes acetone, methylethyl ketone, methyl iso-butyl ketone, cyclohexanone, isopropyl methyl ketone, 2-pentanone, 3-pentanone, 3-hexanone, diisopropyl ketone, 2-hexanone, cyclopentanone, 4-heptanone, iso-amyl methyl ketone, 3-heptanone, 2-heptanone, 4-methoxy-4-methyl-2-pentanone, 5-methyl-3-heptanone, 2-methylcyclohexanone, diisobutyl ketone, 5-methyl-2-octanone, 3-methylcyclohexanone, 2-cyclohexen-1-one, 4-methylcyclohexanone, cycloheptanone, 4-tert-butylcyclohexanone, isophorone, benzyl acetone, or any combination thereof.

An exemplary nitrile solvent includes acetonitrile, acrylonitrile, trichloroacetonitrile, propionitrile, pivalonitrile, isobutyronitrile, n-butyronitrile, methoxyacetonitrile, 2-methylbutyronitrile, isovaleronitrile, N-valeronitrile, n-capronitrile, 3-methoxypropionitrile, 3-ethoxypropionitrile, 3,3'-oxydipropionitrile, n-heptanenitrile, glycolonitrile, benzonitrile, ethylene cyanohydrin, succinonitrile, acetone cyanohydrin, 3-n-butoxypropionitrile, or any combination thereof.

An exemplary sulfoxide solvent includes dimethyl sulfoxide, di-n-butyl sulfoxide, tetramethylene sulfoxide, methyl phenyl sulfoxide, or any combinations thereof.

An exemplary amide solvent includes dimethyl formamide, dimethyl acetamide, acylamide, 2-acetamidoethanol, N,N-dimethyl-m-toluamide, trifluoroacetamide, N,N-dimethylacetamide, N,N-diethyldodecanamide, epsilon-caprolactam, N,N-diethylacetamide, N-tert-butylformamide, formamide, pivalamide, N-butyramide, N,N-dimethylacetoacetamide, N-methyl formamide, N,N-diethylformamide, N-formylethylamine, acetamide, N,N-diisopropylformamide, 1-formylpiperidine, N-methylformanilide, or any combinations thereof.

A crown ether contemplated includes any one or more crown ethers that can function to assist in the reduction of the chloride content of an epoxy compound starting material as part of the combination being treated according to the invention. An exemplary crown ether includes benzo-15-crown-5; benzo-18-crown-6; 12-crown-4; 15-crown-5; 18-crown-6; cyclohexano-15-crown-5; 4',4"(5")-ditert-butyldibenzo-18-crown-6; 4',4"(5")-ditert-butyldicyclohexano-18-crown-6; dicyclohexano-18-crown-6; dicyclohexano-24-crown-8; 4'-aminobenzo-15-crown-5; 4'-aminobenzo-18-crown-6; 2-(aminomethyl)-15-crown-5; 2-(aminomethyl)-18-crown-6; 4'-amino-5'-nitrobenzo-15-crown-5; 1-aza-12-crown-4; 1-aza-15-crown-5; 1-aza-18-crown-6; benzo-12-crown-4; benzo-15-crown-5; benzo-18-crown-6; bis((benzo-15-crown-5)-15-ylmethyl)pimelate; 4-bromobenzo-18-crown-6; (+)-(18-crown-6)-2,3,11,12-tetra-carboxylic acid; dibenzo-18-crown-6; dibenzo-24-crown-8; dibenzo-30-crown-10; ar-ar'-di-tert-butyldibenzo-18-crown-6; 4'-formylbenzo-15-crown-5; 2-(hydroxymethyl)-12-crown-4; 2-(hydroxymethyl)-15-crown-5; 2-(hydroxymethyl)-18-crown-6; 4'-nitrobenzo-15-crown-5; poly-[(dibenzo-18-crown-6)-co-formaldehyde]; 1,1-dimethylsila-11-crown-4; 1,1-dimethylsila-14-crown-5; 1,1-dimethylsila-17-crown-5; cyclam; 1,4,10,13-tetrathia-7,16-diazacyclooctadecane; porphines; or any combination thereof.

In another embodiment, the liquid medium includes water. A conductive polymer complexed with a water-insoluble colloid-forming polymeric acid can be deposited over a substrate and used as a charge-transport layer.

Many different classes of liquid medium (e.g., halogenated solvents, hydrocarbon solvents, aromatic hydrocarbon solvents, water, etc.) are described above. Mixtures of more than one of the liquid medium from different classes may also be used.

The liquid composition may also include an inert material, such as a binder material, a filler material, or a combination thereof. With respect to the liquid composition, an inert material does not significantly affect the electronic, radiation emitting, or radiation responding properties of a layer that is formed by or receives at least a portion of the liquid composition.

4. Fabrication Before Introduction of Liquid Composition(s)

Figure 2:
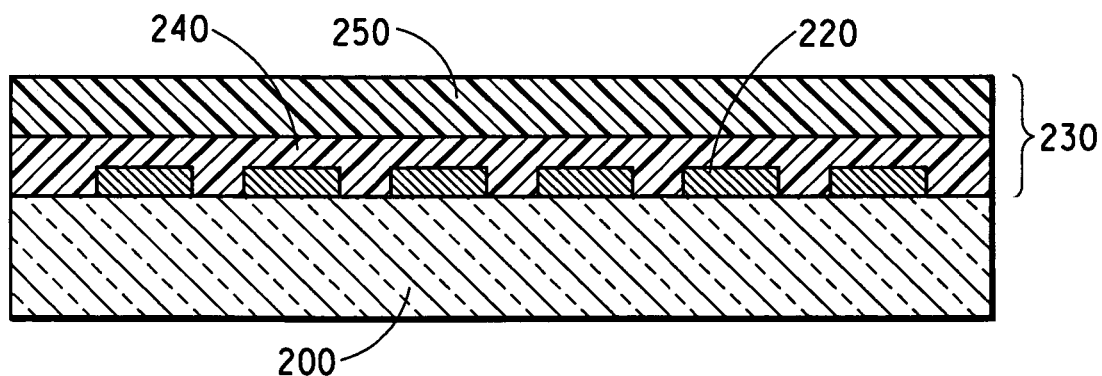
FIG. 2 includes an illustration of a cross-sectional view of a portion of a substrate including first electrodes and a portion of an organic layer.

Attention is now directed to details in an exemplary embodiment that is described and illustrated in FIGS. 2 to 5. Referring to FIG. 2, first electrodes 220 are formed over portions of the substrate 200. The substrate 200 may be a conventional substrate as used in the organic electronic device arts. Substrate 200 can be flexible or rigid, organic or inorganic. Generally, glass or flexible organic films are used. A pixel driver or another circuit (not illustrated) may be formed within or over the substrate 200 using conventional techniques. Other circuit outside the array may include peripheral or remote circuitry used to control one or more of the pixels within the array. The focus of fabrication is on the pixel array rather than the peripheral or remote circuitry. The substrate 200 can have a thickness in a range of approximately 12 to 2500 microns.

The first electrodes 220 act as anodes and may include one or more conductive layers. The surface of the first electrodes 220 furthest from the substrate 200 includes a high work function material. In this illustrative example, the first electrodes 220 include one or more of layers of indium tin oxide, aluminum tin oxide, or other materials conventionally used for anodes within electronic devices. In this embodiment, the first electrodes 220 transmit at least 70% of the radiation to be emitted from or responded to by subsequently formed organic active layer(s). In one embodiment, the thickness of the first electrodes 220 is in a range of approximately 100 to 200 nm. If radiation does not need to be transmitted through the first electrodes 220, the thickness may be greater, such as up to 1000 nm or even thicker. The first electrodes 220 may be formed using one or more of any number of conventional techniques, including depositions and optional patterning sequences.

An organic layer 230 may be formed over the first electrodes 220 as illustrated in FIG. 2. The organic layer 230 may include one or more layers. For example, the organic layer can include an organic active layer and any one or more of a buffer layer, a charge-injecting layer, a charge-transport layer, or a charge-blocking layer. A charge-blocking layer may be an electron-blocking layer or a hole-blocking layer, a charge-injecting layer may be an electron-injecting layer or a hole-injecting layer, and a charge-transport layer may be an electron-transport layer or a hole-transport layer. In one embodiment, the organic layer 230 may include a charge-transport layer 240 and organic active layer 250.

The charge-transport layer 240 and the organic active layer 250 are formed sequentially over the first electrodes 220. Each of the charge-transport layer 240 and the organic active layer 250 can be formed by one or more of any number of different techniques including spin coating, casting, vapor depositing (chemical or vapor), printing (ink-jet printing, screen printing, solution dispensing (dispensing the liquid composition in strips or other predetermined geometric shapes or patterns, as seen from a plan view), or any combination thereof, other depositing technique or any combination thereof for appropriate materials as described below. One or both of the charge-transport layer 240 and the organic active layer 250 may be cured after deposition.

When the charge-transport layer 240 acts as a hole-transport layer, one or more of materials may be used (and its selection will depend on the device and the organic active layer 250 material) and in this illustrative example, it may include one or more of polyaniline ("PANI"), poly(3,4-ethylenedioxythiophene) ("PEDOT"), polypyrrole, or material(s) conventionally used as a hole-transport layer as used in an electronic device. The hole-transport layer typically has a thickness in a range of approximately 50 to 250 nm as measured over centers of the first electrodes 220.

The composition of the organic active layer 250 typically depends upon the application of the electronic device. In the embodiment illustrated in FIG. 2, the organic active layer 250 is used in radiation-emitting components. The organic active layer 250 can include material(s) as conventionally used as an organic active layer in an electronic device and can include one or more small molecule materials, one or more polymer materials, or any combination thereof. After reading this specification, skilled artisans will be capable of selecting appropriate material(s), layer(s) or both for the organic active layer 250. In one embodiment, the organic active layer 250 is no greater than 40 nm. In another embodiment, the organic active layer 250 has a thickness in a range of approximately 20 to 40 nm as measured over centers of the first electrodes 220.

As formed, the organic layer 230 (including charge-transport layer 240 and organic active layer 250) is substantially continuous over an array of electronic components being formed. In one embodiment, the organic layer 230 may be substantially continuous over the entire substrate, including the peripheral circuitry area, remote circuitry area or both areas. Note that the organic layer 230 has one or more regions where the organic layer 230 is locally thinner, but it is not discontinuous over the area of the substrate 200 in which the organic layer 230 is intended to be formed (e.g., the array). Referring to FIG. 2, the organic layer 230, including one or both of the charge-transport layer 240 and the organic active layer 250, is locally thinner over the first electrodes 220 and locally thicker away from the first electrodes 220. In one embodiment, the organic layer 230 has a thickness in a range of approximately 10 to 290 nm as measured over centers of the first electrodes 220.

If the electronic device is a radiation-emitting microcavity device, care is taken in choosing the thickness of the organic layer 230 so that the desired spectrum of emission wavelengths is obtained.

Figure 7:
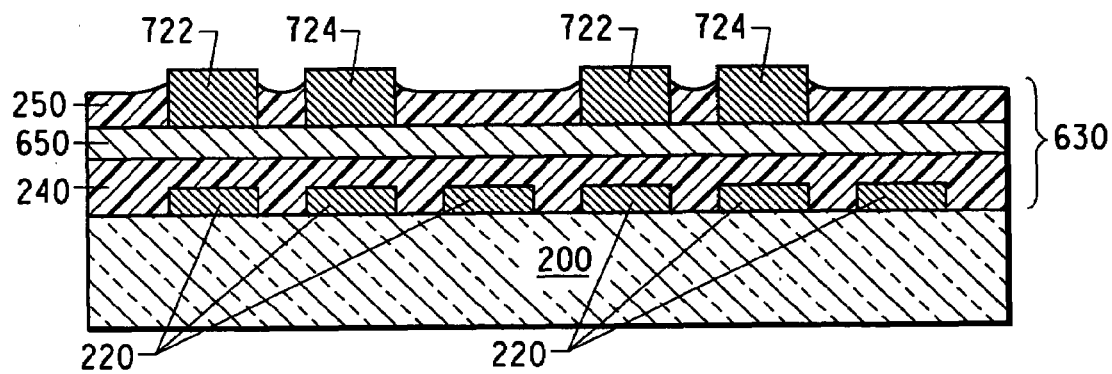
FIG. 7 includes an illustration of a cross-sectional view of the substrate of FIG. 6 after guest materials have intermixed with the organic layer.
Figure 8:
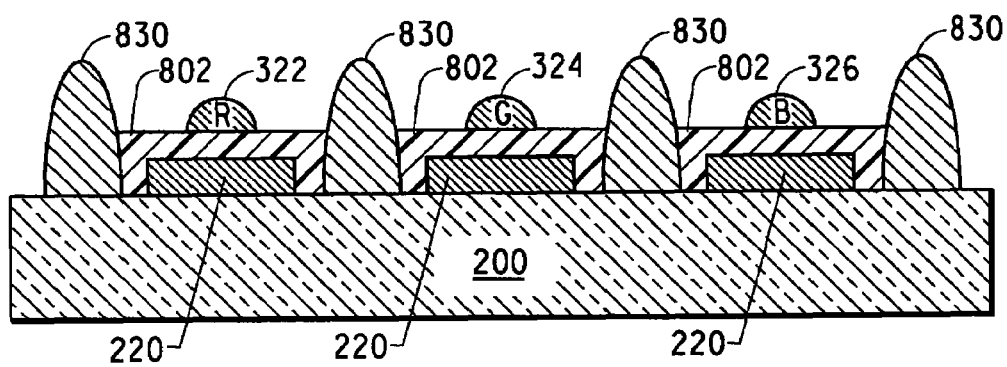
FIG. 8 includes an illustration of a cross-sectional view of a portion of a substrate, first electrodes, a well structure, a charge-transport layer, and liquid compositions lying within openings of the well structure.

In another embodiment, the well structure could be formed similar to the well structure 130 as illustrated in FIG. 1. In this embodiment, the organic layer 230 may be formed over the substrate 200 and the well structure. Note that the organic layer 230 may be locally thinner along the sides near the top of the well structure; however, the organic layer 230 has no discontinuity over the well structure between the first electrodes 220. FIGS. 7 and 8, which are described later, include still another embodiment that can use a well structure.

In an alternative embodiment, the organic layer 230 may include a single layer with a composition that varies with thickness. For example, the composition nearest the first electrodes 220 may act as a hole transporter, the next composition may act as an organic active layer, and the composition furthest from the first electrodes 220 may act as an electron transporter. Similarly, the function of charge-injecting, charge-blocking, or any combination of charge-injecting, charge-transport, and charge-blocking can be incorporated into the organic layer 230. One or more materials may be present throughout all or only part of the thickness of the organic layer.

5. Introduction of Liquid Composition(s)

Figure 3:
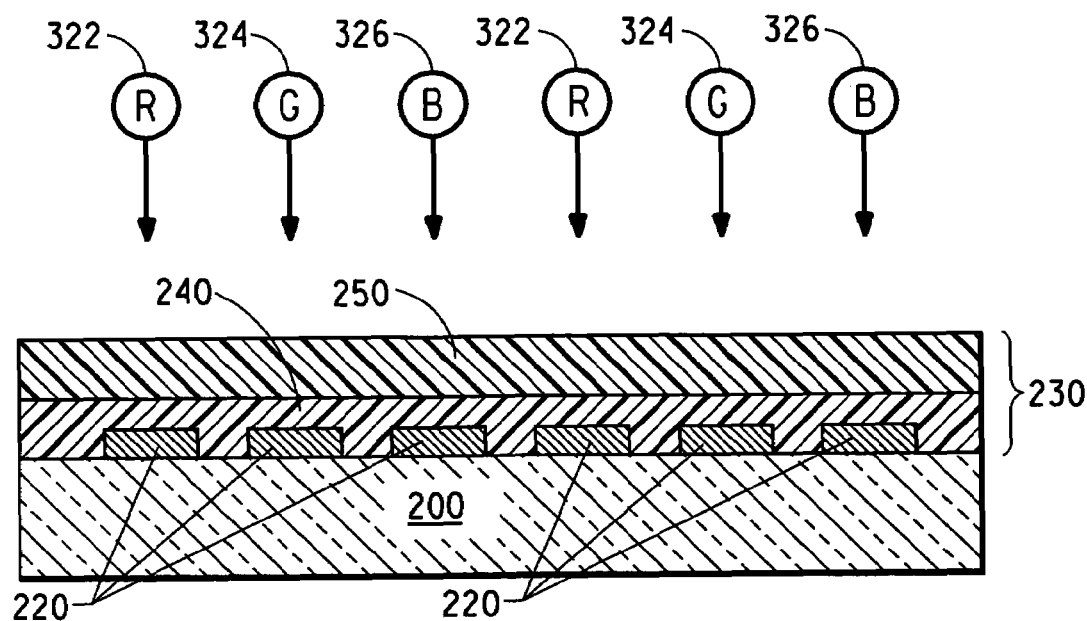
FIG. 3 includes an illustration of a cross-sectional view of the substrate of FIG. 2 as guest materials are deposited onto the organic layer.

One or more liquid compositions (illustrated as circles 322, 324 and 326) may be placed over portions of the organic layer 230 as illustrated in FIG. 3. In one embodiment, the organic active layer 250 includes a host material that can emit blue light, liquid composition 322 may include a red guest material, liquid composition 324 may include a green guest material and liquid composition 326 may include a blue guest material that can be the same or different than the blue host material. Before the placement of one or more liquid compositions 322, 324, and 326, the organic layer 230 may or may not be substantially solid. The liquid compositions 322, 324, and 326 may be placed over the organic layer 230 using a precision deposition technique. A stencil mask, frame, well structure, patterned layer or other structure(s) may or may not be present during such deposition. Non-limiting examples of the precision deposition technique include screen printing, ink-jet printing, solution dispense, needle aspiration, selective plating, and combinations thereof.

The liquid compositions 322, 324, and 326 may be placed over the organic layer 230 sequentially or simultaneously. For simplicity, each of the liquid compositions 322, 324, and 326 in FIG. 3 is referred to as a "stream," whether or not any one or more of the liquid compositions 322, 324, and 326 is introduced as a stream. One or more parameters can be varied that affect the initial area of the organic layer 230 affected by the liquid compositions 322, 324, and 326. For example, such parameters are selected from a group consisting of volume or width of the stream, spacing between electronic components, viscosity, degree of cross-linking of organic layer 230, or any combination thereof.

The liquid medium from the liquid compositions 322, 324, and 326 can come in contact with and convert localized regions of the organic layer 230 from a substantially solid state to a substantially liquid state. As the liquid medium from each stream contacts the localized region of the organic layer 230, the liquid medium can dissolve part or all of a thickness of the localized region of the organic layer 230 to form a solution, disperse part or all of a thickness of the organic layer 230 to form a dispersion, form an emulsion, or suspend part or all of a thickness of the organic layer 230 to form a suspension. In one embodiment, if the charge-transport layer 240 is fully cross-linked or has poor solubility in the liquid medium used for the liquid solution, the formation of a solution, dispersion, emulsion or suspension is limited to the organic active layer 250. Note that as more of the liquid medium interacts with the localized region of the organic layer 230, the viscosity of the "mixture" of liquid composition and the localized region of the organic layer 230 increases. The increased viscosity effectively inhibits lateral movement (movement substantially parallel to the primary surface of the substrate 200) of the streams. In one embodiment, the intermixing of the guest material(s) with the localized region of the organic layer 230 may be performed at a temperature no greater than 40° C., and in another embodiment, may be performed at substantially room temperature.

When the liquid composition 322, 324 or 326 or a combination thereof is to be placed onto the organic layer 230 as drops, the volume selected for the drop(s) may be affected by the thickness of the organic layer 230 or portion thereof, by the host material within the organic layer 230, or a combination thereof. In one embodiment, the guest material from the drop only needs to intermix with a localized region of the organic active layer 250. If the drop volume is too small, not all of the thickness of the localized region of the organic active layer 250 may be affected. Similar affects may be seen with streams if the ratio of the flow rate to printing head scanning speed is too low. Also, if the guest material concentration within the localized region of the organic active layer 250 is too low, the targeted luminance efficiency might not be achieved. During operation, the emission or response wavelength or spectrum of radiation for the localized region of the organic active layer 250 may be significantly affected by the voltage difference between the first and second electrodes.

If the drop volume is too large, undesired lateral spreading of the liquid composition may occur, and the guest material may extend beyond the localized region and reach a neighboring region where the guest material within such neighboring region is undesired. For example, if the volume of a red-colored drop is too large, it may enter a region that is to have green or blue emission. If such happens, the neighboring region may emit red or otherwise change the color emission from the subpixel. Therefore, a ratio of volume of liquid composition to thickness of the organic layer 230 (or more specifically in this embodiment, organic active layer 250) may be used. Again, similar concepts apply when the liquid composition 322, 324, or 326 or any combination thereof is dispensed as a stream.

The use of a well structure may reduce the likelihood of lateral migration, however, the volume of the liquid composition should not be so much as to overflow the "levee" formed by the well structure and migrate into an adjacent well. Note that the liquid composition can lie or flow along a top surface of the well structure between (1) one or more openings in which the liquid composition is intended and (2) other one or more openings in which the liquid composition is not intended. In one embodiment, the walls of the well structure may be perpendicular to the bottoms of the openings, or the walls may have a negative slope (i.e., a portion of the well structure overlies the bottom of the opening). The relatively sharp corner(s) defined by the top surface of the well structure and the walls of the openings, help to "pin" the liquid composition along the top surface of the well structure to reduce the likelihood that the liquid composition flows into any one or more of the adjacent openings where the liquid composition is not intended.

Figure 4:
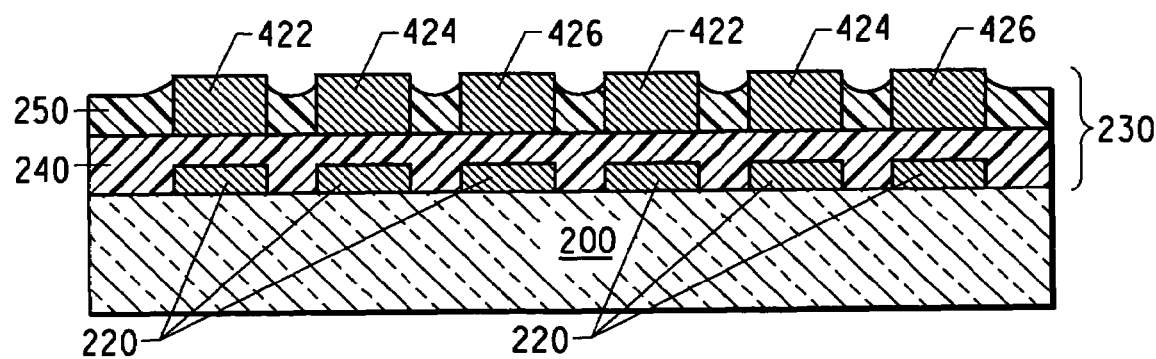
FIG. 4 includes an illustration of a cross-sectional view of the substrate of FIG. 3 after the guest materials have intermixed with the organic layer.

After the liquid compositions 322, 324, and 326 are placed over the organic layer 230 and a substantial amount (addressed later in this specification) of the guest material(s) within the liquid compositions 322, 324, and 326 intermix with the organic active layer 250, the liquid medium of the liquid compositions 322, 324, and 326 is evaporated to give the organic layer 230 with intermixed regions 422, 424, and 426, as illustrated in FIG. 4. In this embodiment, the intermixed regions 422 are designed to emit red light, the intermixed regions 424 are designed to emit green light, and intermixed regions 426 are designed to emit blue light. The evaporation may be performed at a temperature in a range of approximately 20 to 240° C. for a time in a range of approximately 5 seconds to 5 minutes. In one embodiment, the evaporation may be performed at a temperature in a range of approximately 30 to 50° C. for a time in a range of approximately 0.5 to 1.5 minutes. In one embodiment, the evaporation may be performed at ambient temperature. In another embodiment, the evaporation may be performed using an oven or a hot plate. The evaporation may be performed at one or more pressures. In one embodiment, the evaporation may be performed at substantially atmospheric pressure. In another embodiment, a vacuum pressure (significantly lower than atmospheric pressure) may be used. If a vacuum is used, care should be taken to avoid generating permanent bubbles within the organic layer 230 or spewing material to adjacent areas if boiling occurs.

After evaporation, the organic layer 230, including the intermixed regions 422, 424, and 426, is substantially solid. The guest material(s) that were in the streams 322, 324, and 326 before being placed over the organic active layer 250, in combination with the partially or wholly dissolved, dispersed, emulsified or suspended organic active layer 250, create the intermixed regions 422, 424, and 426. After the intermixed regions 422, 424, and 426 are formed, their thicknesses are relatively close to each other. In one embodiment, all of the intermixed regions 422, 424, and 426 have thicknesses within 10 nm of each other. In one specific embodiment, each of the intermixed regions 422, 424, and 426 has a thickness of at least 60 nm. In another embodiment, each of the intermixed regions 422, 424, and 426 has a thickness in a range of approximately 50 to 100 nm, and in a more specific embodiment, in a range of approximately 70 to 90 nm. In one embodiment, intermixed regions 422, 424, and 426 are at least 20 nm thicker that the organic layer 230 as originally formed at the same locations as the intermixed regions 422, 424, and 426. In another embodiment, the thickness of any one or more intermixed region may be less than 50 nm or more than 100 nm.

If the guest materials are introduced into the organic active layer 250 by repeatedly placing the one or more liquid compositions 322, 324, or 326 over the organic layer 230, it may not be necessary to fully evaporate the liquid medium between successive depositions of the liquid compositions.

If the organic active layer 250 comprises host material(s) that are to be cross linked, the organic active layer 250 may be formed by one or more of any number of different techniques including spin coating, casting, vapor deposition (chemical or vapor), printing ((ink-jet printing, screen printing, solution dispense, or any combination thereof), other deposition technique, or any combination thereof. Before introducing the stream(s) with guest material(s), in one embodiment, the organic active layer 250 may be partially cross linked. Although within the scope of the invention, if the organic active layer 250 is not cross linked, lateral migration of the guest material(s) within the organic active layer 250 may be too high, and if the organic active layer 250 is completely cross linked, the liquid medium may be less likely to form a solution, emulsion, suspension, or dispersion. After introducing the stream(s) with the guest material(s), heat may be used to evaporate the liquid medium used during deposition, if needed, to make the organic active layer 250 substantially solid. However, the temperature or other conditions should not be so aggressive such that further cross linking occurs. The liquid composition(s) can, when placed over to come in contact with the organic active layer 250, have guest material(s) within the composition(s) intermix with the organic active layer 250. The liquid medium for the liquid compositions can then be evaporated, and the organic active layer 250 may be subjected to the conditions sufficient to substantially complete cross linking the organic active layer 250. Actual temperatures and pressure used may depend on the materials used for cross-linking. Such cross-linking conditions may be obtained by the vendor of the cross-linking material or may be determined empirically by performing one or more tests. The degree of cross-linking can be determined in separate experiments by measuring layer thickness before and after spinning a solvent. The more cross-linking, the less material lost in the solvent spin.

The liquid medium helps to intermix the guest material with the organic layer 230 as a solution, dispersion, emulsion, or suspension that is formed by a combination of the liquid medium and organic layer 230. Therefore, a substantial amount of the guest material(s) within the liquid composition(s) may intermix such that the guest material(s) appear to migrate toward the first electrodes 220 without substantial lateral migration or diffusion. The concentration of the guest material(s) near the surface of the organic layer 230 (over which the second electrode(s) is (are) subsequently formed) can be less than an order of magnitude different from the concentration of the guest material(s) near the opposite surface (near the first electrodes 220). The concentrations of the guest material(s) near the opposite sides of the organic active layer 250 are closer to each other. A thermal drive step is not required. The concentration gradient between the first electrodes 220 and a subsequently formed second electrode (concentration gradient measured in a direction perpendicular to the primary surface of the substrate) is lower a concentration gradient formed by a conventional thermal diffusion process. The emission spectra from an electronic device formed by such a technique may not be significantly affected by changing the potential difference between the first and second electrodes.

6. Remainder of Fabrication

Figure 5:
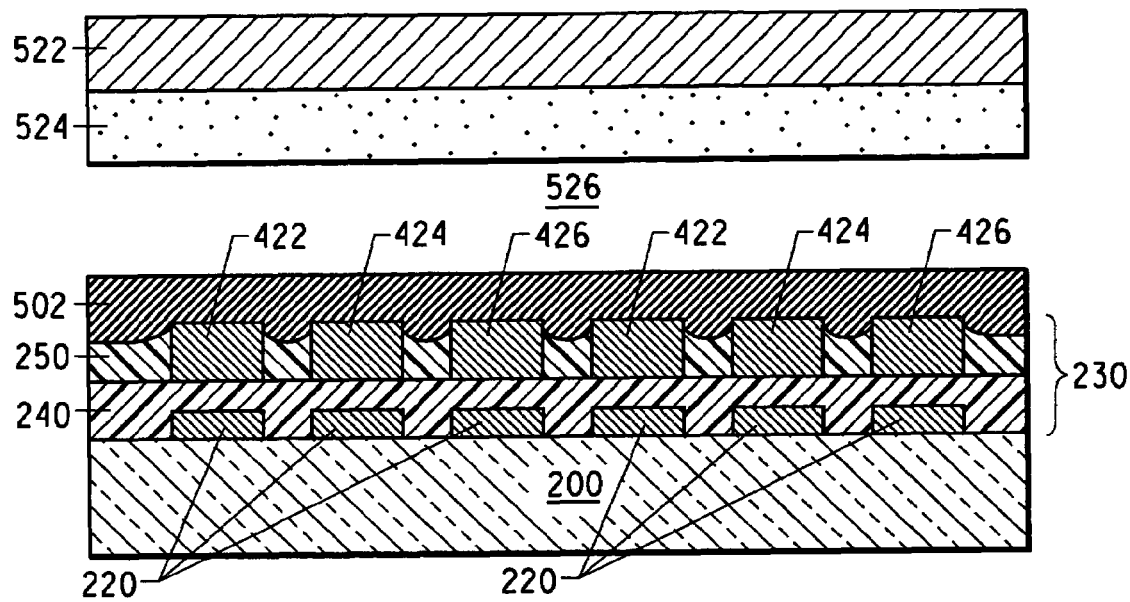
FIG. 5 includes an illustration of a cross-sectional view of the substrate of FIG. 4 after forming a substantially completed electronic device.

Although not illustrated, an optional charge-injecting, charge-transport, or charge-blocking layer(s) may be formed over the organic active layer 250. A second electrode 502 is formed over the organic layer 230, including the charge-transport layer 240 and the organic active layer 250, as illustrated in FIG. 5. In this specific embodiment, the second electrode 502 acts as a common cathode for the array. The formation (e.g., deposition, etching, etc.), materials, and thicknesses for the optional charge-injecting layer, charge-transport layer, charge-blocking layer, or any combination thereof, and the second electrode 502 are conventional.

Other circuitry not illustrated in FIG. 5 may be formed using one or more of the previously described or additional layers. Although not illustrated, additional insulating layer(s) and interconnect level(s) may be formed to allow for circuitry in peripheral areas (not illustrated) that may lie outside the array. Such circuitry may include a row or column decoder, a strobe (e.g., row array strobe, column array strobe), a sense amplifier, or any combination thereof. Alternatively, such circuitry may be formed before, during, or after the formation of any of the layers illustrated in FIG. 5.

A lid 522 with a desiccant 524 is attached to the substrate 200 at locations (not illustrated) outside the array to form a substantially completed device. A gap 526 lies between the second electrode 502 and the desiccant 524. The materials used for the lid 522 and desiccant 524 and the attaching process are conventional.

FIG. 5 includes two pixels that each have red, green, and blue radiation-emitting components. The red radiation-emitting components include the red-intermixed regions 422, and the green radiation-emitting components include the green-intermixed regions 424, and the blue radiation-emitting components include the blue-intermixed regions 426 of the organic active layer 250.

7. Alternative Embodiments

Figure 6:
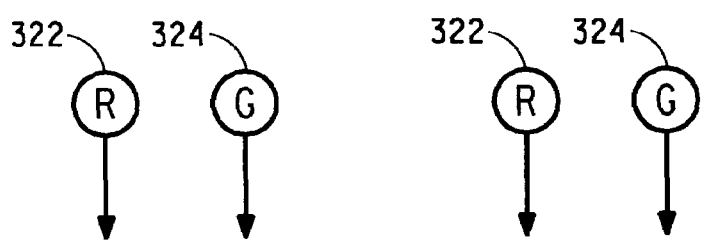
FIG. 6 includes an illustration of a cross-sectional view of a portion of a substrate as guest materials are added to an organic layer including a partially cross-linked layer.
Figure 6:
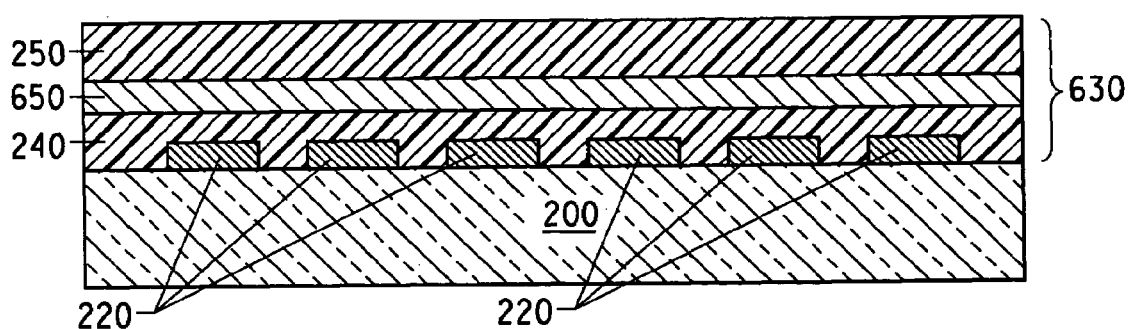

FIG. 6 includes an illustration of an alternate embodiment that is formed in a manner similar to the process described in Section 2 above except that the organic layer 230 is replaced by an organic layer 630. The organic layer 630 includes an electron-blocking layer 650. The materials and formation of the layers 240 and 250 is described above. After forming the charge-transport layer 240, the electron-blocking layer 650 is formed. The electron-blocking layer 650 includes one or more of the materials as previously described. The electron-blocking layer 650 may be formed using one or more of any number of different techniques including a conventional coating, casting, vapor deposition (chemical or vapor), printing (ink-jet printing, screen printing, solution dispense, or any combination thereof, other deposition technique, or any combination thereof. The electron-blocking layer 650 has a thickness in a range of approximately 5 to 200 nm as measured over centers of the first electrodes 220.

In one embodiment, the electron-blocking layer 650 includes one or more materials that can be cross linked. After the material(s) for the electron-blocking layer 650 are deposited, the material(s) can be substantially completely cross linked. The cross linking is performed using a conventional technique.

After formation of the organic layer 630, one or more liquid compositions (illustrated as circles 322 and 324) are placed over organic layer 630 using any one or more of the techniques previously described. In one embodiment, the organic active layer 250 includes a host material that can emit blue light, the liquid composition 322 may include a red guest material, and the liquid composition 324 may include a green guest material. Before the placement of any one or more of the liquid compositions, the organic active layer 250 may or may not be substantially solid. The liquid compositions 322 and 324 may be placed over the organic layer 630 sequentially or simultaneously.

The liquid medium from the liquid compositions 322 and 324 can come in contact with and only convert localized regions of the organic layer 250, and not the electron-blocking layer 650, from a substantially solid state to a substantially liquid state.

After the liquid compositions 322 and 324 are placed over the organic layer 630 and a substantial amount (addressed earlier in this specification) of the guest material(s) within the liquid compositions 322 and 324 intermix with the localized regions of the organic active layer 250. In one embodiment, the electron-blocking layer 650, which is substantially completely cross linked, can help reduce the likelihood that the liquid medium from the liquid compositions 322 and 324 will reach the charge-transport layer 240 or the first electrodes 220. The liquid medium of the liquid compositions 322 and 324 is evaporated as previously described to give the localized regions of the organic active layer 250 with the intermixed regions 722 and 724. In this embodiment, the regions 722 are designed to emit red light, and region 724 is designed to emit green light, as illustrated in FIG. 7.

FIG. 7 includes what will be two pixels that each have red, green, and blue radiation-emitting components after the second electrode 502 (not illustrated in FIG. 7) and subsequent processing are performed as previously described. The red radiation-emitting components include the red-intermixed regions 722, and the green radiation-emitting components include the green-intermixed regions 724, and the blue components include unintermixed portions (substantially free of the red and green guest materials) of the organic active layer 250 lying between two of the first electrodes 220 and the second electrode 502. In one embodiment, the blue radiation-emitting components have an organic active layer 250 thickness no greater than 40 nm and can still achieve one or more opto-electronic properties if the organic active layer 2350 were 70-80 nm thick. For example, the organic active layer 2350 emit blue light at an efficiency in a range of approximately 8 to 10 cd/A. In another embodiment, the red-intermixed regions 722 and green-intermixed regions 724 have a thickness in a range of approximately 90 to 100 nm, and the other regions (for the blue light emitting components) have a thickness in a range of approximately 70 to 80 nm. In still another embodiment, the thicknesses described can be thinner or thicker than those described.

In still a further embodiment, the liquid compositions may be placed over a substrate before forming an organic layer. Referring to FIG. 8, first electrodes 220 are formed over the substrate 200. A well structure 830, portions of which are illustrated in FIG. 8, is formed using a conventional process, such as coating a photoresist layer and patterning it. The well structure 830 may have a thickness in a range of approximately 1 to 5 microns. A charge-transport layer 802 may be formed over the first electrodes 220 and within openings of the well structure 830 using a technique previously described. Liquid compositions 322, 324, and 326 are placed over the charge-transport layer 802 using any one or more of the techniques previously described. The liquid medium within the liquid compositions 322, 324, and 326 may or may not be evaporated at this time.

Figure 9:
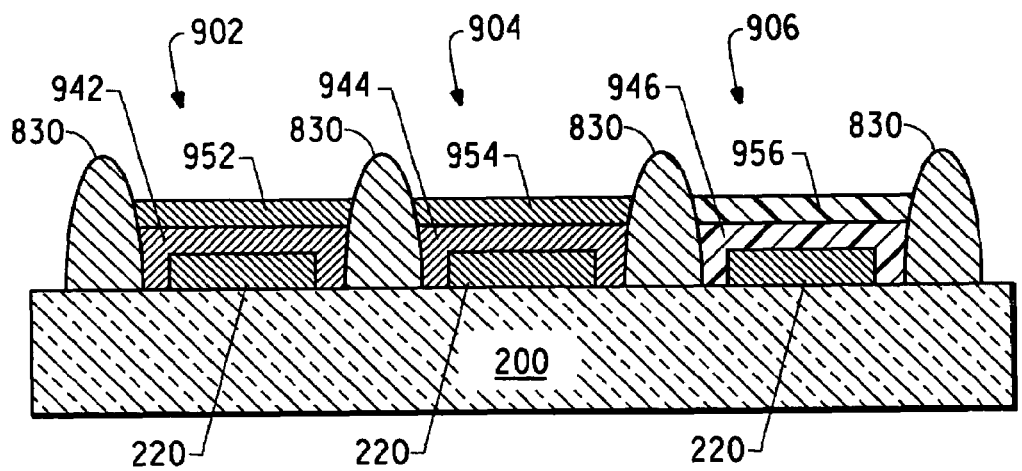
FIG. 9 includes an illustration of a cross-sectional view of FIG. 8 after adding an organic layer within the regions lying within openings of the well structures.

An organic active layer, which, in one embodiment, has a composition and thickness of the organic active layer 250, is formed over the charge-transport layer 802 and within openings of the well structure 830 as illustrated in FIG. 9. The guest material(s) within the liquid compositions 322, 324, and 326 may intermix with both the charge-transport layer 802 and the organic active layer to: (1) form a red-intermixed charge-transport layer 942 and red-intermixed organic active layer 952, which together comprise red-intermixed organic layer 932, for the red radiation-emitting component 902 (2) form a green-intermixed charge-transport layer 944 and green-intermixed organic active layer 954, which together comprise green-intermixed organic layer 934, for the green radiation-emitting component 904, and (3) form a blue-intermixed charge-transport layer 946 and blue-intermixed organic active layer 956, which together comprise blue-intermixed organic layer 936, for the blue radiation-emitting component 906. The organic active layers 952, 954, and 956 can be cured to render the organic active layers 952, 954, and 956 substantially solid. The second electrode 502 (not illustrated in FIG. 9) and subsequent processing may be performed as previously described.

In this embodiment, processing latitude exists to allow the formation of the organic active layer 250 after placing the liquid compositions 322, 324, and 326 over the first electrodes 220. The well structure 830 helps to keep the guest material(s) within compositions 322, 324, and 326 from intermixing with undesired regions.

In another embodiment, the guest material(s) do not significantly intermix with the charge-transport layer 802. However, significant amount(s) of the guest material(s) still intermix with the organic active layer.

In a further embodiment (not illustrated), liquid compositions, including guest materials, may be placed on the first electrodes 220 before the organic layer 230 is formed. The liquid medium within the liquid compositions may be evaporated to become substantially solid before the organic layer 230 is formed over the first electrodes 220. The organic layer 230 can include a liquid medium that can form a solution, dispersion, emulsion, or suspension with the guest materials and limit its lateral migration.

In yet a further embodiment (not illustrated), the guest materials may be introduced into a layer other than an organic active layer. Referring to FIG. 6, the organic active layer 250 may be replaced by the same material used to form the electron-blocking layer 650. More specifically, after forming the electron-blocking layer 650, the same material(s) as the fully cross-linked electron-blocking layer 650 can be deposited to a thickness no greater than approximately 100 nm over the electron-blocking layer 650.

The layer of same material(s) can be partially cross linked. Skilled artisans that the degree of cross linking can be determined in any one or more different empirical methods. The layer may be deposited onto different test substrates. After depositing, the thickness, volume, or mass may be measured. The substrates with the layer can be exposed to different amounts of energy (temperatures, times, radiation or any combination thereof). A solvent can be used to wash away the portion of the layer that is not significantly cross linked without washing away a significant portion of the cross-linked layer. Selection of the solvent is conventional to skilled artisans. Measurements are then performed.

In one embodiment, the amount of the layer remaining is in a range of approximately 50-90% of the initial measurement (before partial cross linking), regardless whether the both sets of measurements were based on thickness, volume, or mass. The amounts of radiation corresponding to that level of cross linking may be used to achieve a partially cross-linked layer for the workpieces within which electronic components are being formed.

The liquid compositions 322, 324, and 326 can be placed over the partial cross-linked layer. The partial cross linking allows the liquid medium to form a solution, dispersion, suspension or emulsion to form, however, the substantially completed cross linking within the electron-blocking layer 650 substantially prevents any one or more of the liquid compositions 322, 324, and 326 from intermixing with the electron-blocking layer 650, into the charge-transport layer 240, reaching the first electrodes 220, or any combination thereof. The fabrication process continues as previously described to form the intermixed regions and substantially completed electronic devices.

In still a further embodiment, other materials and other types of densifications can be performed in forming a layer similar to the electron-blocking layer 650 to substantially stop or otherwise define a lower boundary of the intermixed regions. The densification helps to render the material(s) into a state in which a layer, member, or structure formed from the material(s) are less susceptible to interactions with the liquid compositions that include the guest materials. Densification can include annealing, cross-linking or other polymerization, curing, passivating (reducing the number of dangling bonds), or any combination thereof.

In still another embodiment, a filter layer can lie between an organic active layer and a user side of the electronic device. The filter allows radiation at a wavelength or spectrum of wavelengths to be transmitted through the filter layer. The filter layer does not allow a significant amount of radiation outside such wavelength or spectrum of wavelengths to be transmitted. Therefore, the filter layer can "block" radiation at undesired wavelengths.

Figure 10:
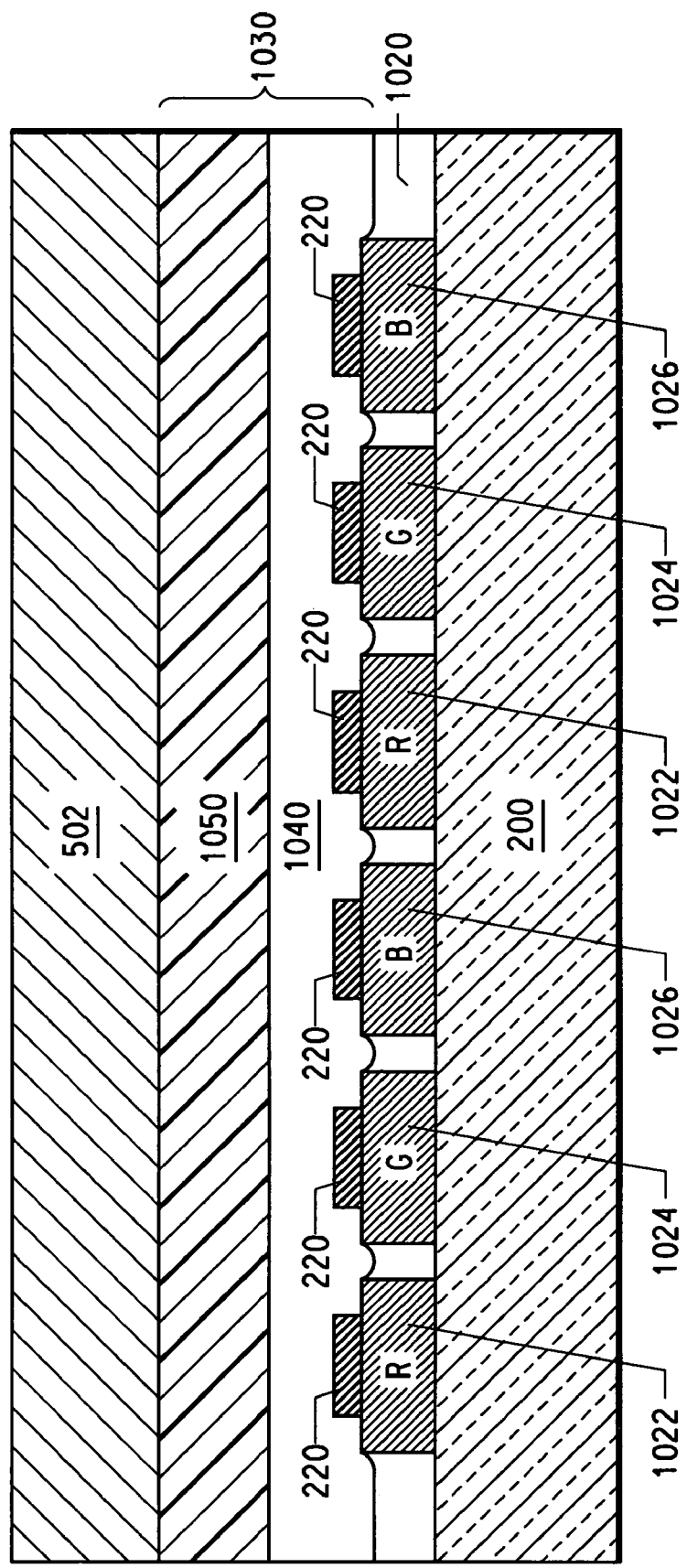
FIG. 10 includes an illustration of a cross-sectional view of a portion of a substrate, first organic layer with filters, first electrodes, a second organic layer, and a second electrode.

An organic layer 1020 can be formed over the substrate 200 as illustrated in FIG. 10. The organic layer 1020 may include one or more layers of nearly any organic material (e.g., a polymeric film) that is used to form part of the substrate 200. The organic layer 1020 may theoretically have nearly any thickness (1 nm to several hundreds of microns or more). However, when the thickness is too thin, the filter layer may not be sufficient to provide a good quality filter layer. At the other end of the range, as the filter layer becomes thicker, the intensity of radiation to be transmitted through the filter layer is reduced. In one embodiment, the organic layer 1020 has a thickness in a range of approximately 1 to 10 microns.

The organic layer 1020 can be formed by one or more of any number of different techniques including spin coating, casting, vapor deposition (chemical or vapor), printing (ink-jet printing, screen printing, solution dispense, or any combination thereof, other depositing technique, or any combination thereof for an organic material. Alternatively, the organic layer 1020 can be formed over the substrate 200 using a mechanical process. One mechanical process may include using an adhesive layer (not illustrated) on the substrate 200 or organic layer 1020 and placing the organic layer 1020 near the substrate 200 so that the adhesive layer lies between the organic layer 1020 and substrate 200. Alternatively, the organic layer 1020 can be placed over the substrate 200 and heated to allow the organic layer 1020 and substrate 200 to fuse together. The processes described are only two of potentially may other mechanic processes that may be used.

Any one or more of the processes as previously described regarding the liquid compositions can be used to introduce guest materials into the organic layer 1020. Red-intermixed regions 1022 include a red guest material, green-intermixed regions 1024 include a green guest material, and the blue-intermixed regions 1026 include a blue guest material.

Formation of the rest of the electronic device is similar to any of the processes previously described above except that guest materials may or may not be added to organic layer 1030. In one embodiment, the organic layer 1030 includes organic active layer 1050 that may emit substantially white light. The red-intermixed regions 1022 may allow red light, and not green light or blue light, to be transmitted through the organic layer 1020 to the user side of the electronic device. The green-intermixed regions 1024 and blue-intermixed regions 1026 perform similar functions for green light and blue light, respectively.

If the electronic device includes radiation-responsive components, the red-intermixed regions 1022 may allow red light, and not green light and blue light, to be transmitted through the organic layer 1020 to the organic active layer 1050. The green-intermixed regions 1024 and blue-intermixed regions 1026 perform similar functions for green light and blue light, respectively.

In a further embodiment (not illustrated), fabrication of the filter layer may be performed separate from substrate 200. The fabrication process for an organic layer, similar to organic layer 1020, may be performed and the organic layer with filter regions may be attached to the substrate 200 before, during or after the formation of electronic components. In one embodiment, driver or other circuits may be formed over substrate 200 before the filter layer is attached. After the filter layer is attached, the organic layers (e.g., organic active layer) for electronic components may be formed. In this manner, the organic active layer may not be exposed to relatively higher temperatures that may be used to attach the filter layer to the substrate 200.

In another embodiment not illustrated, the charge-transport layer 240 and not the organic active layer 250 may include the guest materials. Although the charge-transport layer 240 is a filter layer in theory, the guest material in the charge-transport layer 240 can help to get color emission or reception by the organic active layer 250 closer to the wavelengths as specified in the Commission Internationale de l'Éclairage ("CIE") standards. In still other embodiments, a charge-injecting layer, a charge-blocking layer, or a combination thereof may be used in place of or in conjunction with the charge-transport layer 240.

In still another embodiment, the positions of the first and second electrodes may be reversed. The second electrode 502 may be closer to the substrate 200 compared to the first electrodes 220. If radiation is to be transmitted through the second electrode 502, the thickness of the second electrode 502 may be reduced to allow sufficient radiation (at least 70%) to be transmitted through it.

In yet another embodiment, radiation may be emitted or received through a side of the electronic device opposite the substrate 200 instead of or in addition to radiation being emitted or received through the substrate side of the electronic device. In such a device, each of the second electrode 502 and the lid 522 may allow at least 70% of the radiation to be emitted from or received by the organic active layer 250. The location of the desiccant 524 may be changed so that it does not overlie the first electrodes 220. Alternatively, the desiccant 524 may include one or more materials of a thickness(es) where at least 70% of the radiation to be emitted from or received by the organic active layer 250 to pass through the desiccant 524.

In yet another embodiment, the second electrode 502 may be replaced by a plurality of second electrodes. Any one or more of the components in FIG. 5 may have its own second electrode or share the second electrode with some or all other components in an array.

Nearly any electronic device having an organic active layer can use the intermixing techniques previously described. While FIG. 5 includes a configuration that may be used with an active matrix OLED display, the configuration may be changed for a passive matrix OLED display by orienting the first electrodes 220 into conductive strips having lengths extending in a first direction and changing the second electrode 502 into conductive strips having lengths extending in another direction substantially perpendicular to the first direction. Drivers or other circuits (not illustrated in FIG. 5) may not be needed for the passive matrix OLED display. After reading this specification, skilled artisans will appreciate that other modifications may be made for other types of electronic devices to achieve the proper functions of such devices (e.g., sensor arrays, voltaic cells, etc.).

In yet a further embodiment, the organic layer 230 may be designed to emit, be responsive to, or transmit radiation at wavelength(s) outside the visible light spectrum when a guest material is not present within the organic layer 230. For example, one of the electronic components may be designed to have the organic active layer 250 emit or respond to UV, IR, other non-visible radiation, and any combination thereof. In another embodiment, radiation-emitting components and radiation-responsive components may be used in the same device. In still another embodiment, within the same electronic device, one or more the electronic components may emit or respond to radiation within the visible light spectrum, one or more the electronic components may emit or respond to radiation outside the visible light spectrum (e.g., UV, IR, or both), or any combination thereof. The number of combinations is nearly limitless.

The concepts described herein can be used to affect layer(s) that are not designed to emit, respond, or filter radiation. Such an application may be used to form a circuit element including a transistor, a resistor, a capacitor, a diode or any combination thereof. The guest material may change an organic active layer's resistance or conductivity type (p-type or n-type). More specifically, the guest material may be used to adjust a threshold voltage or gain of a transistor, define a current carrying electrode (e.g., a source region, a drain region, a source/drain region, an emitter region, a collector region, an inactive base region, a resistor contact, a capacitor contact, or any combination thereof, form a p-n junction for a capacitor or a diode, or any combination thereof. Note that any of these electronic components may be used in logic, amplifying, or another circuit and may or may not be used for their radiation-related properties.

8. Electronic Operation of the Electronic Device

If the electronic components within the electronic device are radiation-emitting components, appropriate potentials are placed on the first electrodes 220 and second electrode 502. As one or more of the radiation-emitting components become sufficiently forward biased, such forward biasing can cause radiation to be emitted from the organic active layer 250. Note that one or more of the radiation-emitting components may be off during the normal operation of the electronic device. For example, the potentials and current used for the radiation-emitting components may be adjusted to change the intensity of color emitted from such components to achieve nearly any color within the visible light spectrum. Referring to the three first electrodes 220 closest to the right-hand side of FIG. 5, for red to be displayed, radiation-emitting component including intermixed region 422 will be on, while the other two radiation-emitting components are off. In a display, rows and columns can be given signals to activate the appropriate sets of radiation-emitting components to render a display to a viewer in a human-understandable form.

If the electronic components within the electronic device are radiation-responsive components, the radiation-responsive components may be reversed biased at a predetermined potential (e.g., second electrode 502 has a potential approximately 5 to 15 volts higher than the first electrode(s) 220). If radiation at the targeted wavelength or spectrum of wavelengths is received by the organic active layer, the number of carriers (i.e., electron-hole pairs) within the organic active layer increases and causes an increase in current as sensed by sense amplifiers (not illustrated) within the peripheral circuitry outside the array.

In a photovoltaic cell, light or other radiation can be converted to energy that can flow without an external energy source. The conductive members 220 and 502 may be connected to a battery (to be charged) or an electrical load. After reading this specification, skilled artisans are capable of designing the electronic components, peripheral circuitry, and potentially remote circuitry to best suit their particular needs for their particular electronic device.

9. Advantages

Unexpectedly, the processes described above can be used to form a localized region within an organic layer before or after the organic layer is formed where the guest material concentration gradient between the opposite surfaces of an organic layer (i.e., near the electrodes) is smaller compared to conventional diffusion processes, and without the substantial lateral migration as seen with many conventional diffusion processes. A substantial amount, if not all, of the guest material intermixes with the organic layer. The guest material can be intermix with the organic layer and obviate the need to perform a thermal diffusion process. Therefore, a problem with too much lateral diffusion should not occur. Also, a "partial" diffusion (through only part of the targeted layer), a steep concentration gradient for guest material through the thickness of the targeted layer, or both should not occur.

Compare the new process to a conventional process. In one conventional process, a guest material is diffused from an ink outside the organic layer, and no more than about 25% of the guest material enters the organic layer. The concentrations of the guest material near the first and second electrodes using this conventional process may be anywhere from a few to several orders of magnitude different. In the new processes described herein, the guest material concentrations near the first and second electrodes should be less than an order of magnitude different, and possibly less than that. The lower concentration gradient allows the electronic component(s) to be operated over a larger potential difference without causing a shift in an emission or reception spectrum. Therefore, better "gray-scale" intensity control can be seen. Also, the electronic device can be operated at higher voltages as the efficiency of such device decreases with age without a significant shift in the emission spectrum.

Compare the new process to a conventional diffusion process where the diffusion is performed until the guest material concentration gradient is close to zero (concentrations near opposite sides of the organic layer are substantially equal). This conventional diffusion process allows too much lateral diffusion and makes its use within a high resolution array very difficult.

If a guest material thermal drive step is used with the conventional ink diffusion process to reduce the guest material concentration gradient, the guest material may also laterally migrate to a point where it could interfere with the proper radiation emission or reception of adjacent electronic components. In a filter layer, the filter may have undesired filtering characteristics. Because the new processes do not use a guest material drive step, the amount of lateral migration of guest material is kept relatively low.

Also, the processes described herein can increase the ratio of the guest materials to the host material. Referring to FIGS. 4 and 5, the intermixed regions 422 comprise a red guest material and a blue host material, and the intermixed regions 424 comprise a green guest material and a blue host material. Because the organic active layer is no more than approximately 40 nm thick, the ratio of guest material:host material increases as compared to when the organic active layer 250 is 70 to 90 nm thick. The higher ratio can allow the electronic components having the intermixed regions 422 and 424 to operate at a lower voltage. Additionally, the thinner organic active layer also allows each of the intermixed regions 422, 424, and 426 to have thicknesses optimized for each of the colors (red, green, and blue). In one embodiment, the ratio of guest material to host material, on a mass basis, is 1:2 or higher, and in another embodiment, the ratio is at least 1:1. Compare to a conventional process where the ratio may be 1:3 or lower.

The new processes can be used to introduce a guest material into an organic active layer and still achieve good emission efficiency because an ink diffusion process is not required. An efficiency higher than 0.4 cd/A can be achieved. In one embodiment, the efficiency of the red-intermixed regions 422 is at least 1.1 cd/A, the efficiency of the green-intermixed regions 424 is at least 3.0 cd/A, and the efficiency of the blue-intermixed regions 426 is at least 1.1 cd/A. Even higher efficiencies are possible.

The new process is not as sensitive to thickness as the conventional ink diffusion process. Because the guest material concentration gradient is lower, the volume of liquid composite can be adjusted for different thicknesses of the layer that includes the host material. The process allows for more flexibility if a different thickness of the organic layer is desired. The conventional ink diffusion process is highly sensitive to thickness changes due to the steep concentration gradient. Again, a thermal diffusion processing step is not required with the new process.

When forming an electronic device, a more abrupt p-n junction may be formed. The more abrupt junction helps to increase the breakdown voltage, improve capacitance at the junction, or a combination thereof. Also, an enhancement-mode transistor, a depletion-mode transistor, or a combination thereof may be formed using the same organic active layer. Smaller and more closely space electronic components may be made, and thereby increase circuit density. Additionally, less lateral diffusion allows smaller electronic components to be formed.

In one embodiment, the liquid medium of the liquid composite can interact with the organic layer, thus raising the viscosity of the resulting solution, dispersion, emulsion, or suspension. The increased viscosity helps to keep lateral motion under control as the liquid medium and guest material(s) work their way through the thickness of the organic layer. Therefore, the well structure is not required but may be used, if desired. If a well structure is not formed, one or more process steps may be reduced, thereby saving production costs and potentially improving yields.

The new process can be performed using existing equipment and can be integrated into an existing process without substantial modification of the process. Therefore, the new process can be implemented without significant risk of having to learn and characterize new equipment or creating undue complications during process integration.

EXAMPLES

The following specific examples are meant to illustrate and not limit the scope of the invention.

Example 1

This Example demonstrates that appropriate manipulation of one or more physical properties of the organic active layer, and the liquid composition provides an electronic component in an electronic device without the need for a bank or well.

Electronic components are fabricated to include the following structure: ITO (first electrodes, or anodes)/buffer polymer/organic active/second electrode (cathode). The substrate is 30×30 mm (nominal) ITO coated glass. The charge-transport layer is a PEDOT material (BAYTRON-P™, Bayer AG, Germany). The organic active layers include a blue-emitting polyfluorene material (a host material capable of emitting blue light without any guest material). PEDOT is spin-coated onto a flat glass/ITO substrate at room temperature and then baked at approximately 200° C. for approximately 5 minutes. The film thickness is approximately 60-80 nm, as measured with a Dektec surface profiler. The blue-color organic active layer is then deposited from approximately 0.5% o-xylene solution at approximately 1400 rpm, which results in a film thickness of approximately 20 to 40 nm.

A liquid composition includes a red guest material (a red light-emitting poly(spirobifluorene) material, 1.1%, 11 mg/ml) and liquid medium including solvent mixtures of anisole and o-xylene. The liquid composition is dropped onto pre-defined areas with a single nozzle inkjet machine with a nozzle diameter of 30 microns, nominal. The spacing between each drop is set at approximately 90 microns and the spacing between the rows of the drops is approximately 200 nm. The drops do not coalesce, and remain at a fixed width governed by such parameters as drop volume and organic active layer thickness. The size of the round red dots is approximately 80 microns, or approximately one-third of the spacing between adjacent rows. The film is then baked at 120° C. for 10 approximately minutes. The resulting red-intermixed regions have a thickness of approximately 75 nm. The second electrode is deposited using a thermal evaporator and contains approximately 3.5 nm Ba covered with approximately 500 nm aluminum. At a bias of approximately 4 V between the ITO and second electrode, the emission intensity is approximately 200 cd/m$^2$.

As an alternative, the red liquid composition is replaced with a green liquid composition. The red guest material is replace by one or more green guest materials (e.g. a Green 1300 Series™ polyfluorene, Dow Chemical Company, Midland, Mich.). The processing details and equipment used is substantially the same as previously describe. A similar pixel size is achieved with green emission zones.

This example demonstrates that the processes described herein can be used to fabricate an electronic device with multiple colors, (i.e., one or more regions with only the host material of the organic active layer emit blue light, one or more regions with host material and red guest material emit red light, and regions with the host material, and one or more green guest material emit green light.) This example also demonstrates that a well structure is not needed to define emitting zones.

Example 2

This Example demonstrates that the processes described herein can be used to fabricate full color displays with a 200 micron pitch or greater.

An experiment similar to Example 1 is performed, using a full-color display with 300 micron pixel pitch, nominal. The diameter of the ink-jet nozzle is reduced to approximately 18 micron, and a display with multiple colors in a pre-defined pattern is produced using this smaller diameter nozzle. The diameter of the red, green, and blue-intermixed regions is reduced to approximately 65 micron. The thicknesses of the red, green, and blue-intermixed regions are in a range of approximately 60 to 90 nm. Therefore, the processes described herein can be used to fabricate full color displays with less than a 200 micron pitch.

Example 3

A full color display with red, green and blue polymer lines is produced using a procedure similar to that described in Example 1. An ink-jet printer with 40 nozzles is used for defining color pixels. The diameter of these nozzles is approximately 35 microns and the step motion between each drop is approximately 85 microns. The substrate is 100 mm×100 mm (4 inch×4 inch), nominal with a display area of approximately 80 mm×60 mm (3.2 inch×2.4 inch). The substrate does not include a well structure. The red, green and blue color stripes indicate: (1) a line pattern can be achieved without using bank structures, and (2) a full-color display can be made with 100 pixels-per-inch (equivalent to 254 micron pitch).

A full color, active matrix display is also fabricated with a substrate with thin-film-transistor pixel drivers. An organic active layer is constructed between the pixel drivers and the ITO contacts. As in Examples 1 and 2, a bank structure is not required for color ink confinement.

Example 4

In this Example, a full color backlight device is produced with a totally planar structure (i.e., ITO is continuous, no pads or columns). Starting from an optically flat glass ITO substrate, PEDOT and an organic layer (a host material capable of emitting blue light) are spin coated onto the substrate (as previously described). Continuous stream printing is used to form lines of a red liquid composition and a green liquid composition. The lines are approximately 50 microns wide without any well structure used. This example clearly demonstrates the ability of the organic layer to limit spreading of the red and green polymer lines.

By changing the width of the stream, flow rate, and nozzle speed, the line width can be varied from approximately 50 microns to approximately 150 microns, making this process suitable for the production of larger area displays.

Similarly, a lower solubility host layer may result in greater lateral diffusion of the liquid composition since a larger volume of liquid composition per surface area of the substrate may be required to allow the guest material to intermix fully and substantially uniformly through the thickness of the host layer.

Example 5

The color stability can be maintained over 2 to 3 orders of magnitude variation in current for a full-color display, allowing for gray scale control for each color without a significant shift in emission spectrum.

Figure 11:
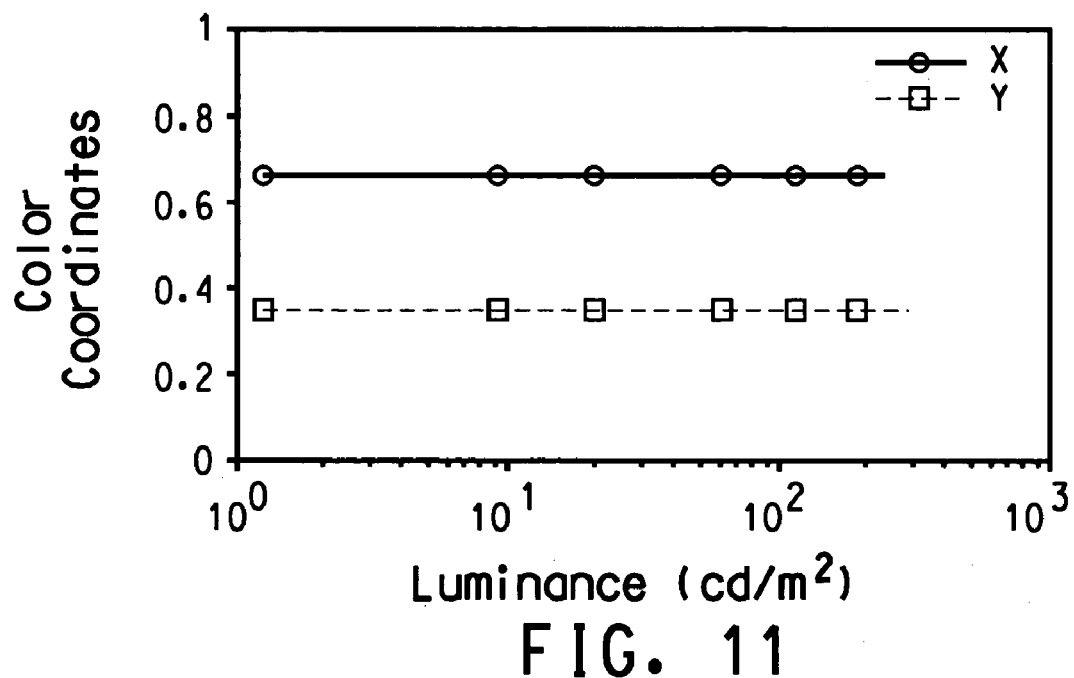
FIGS. 11 to 13 include plots of color coordinates for varying intensities of radiation.
Figure 12:
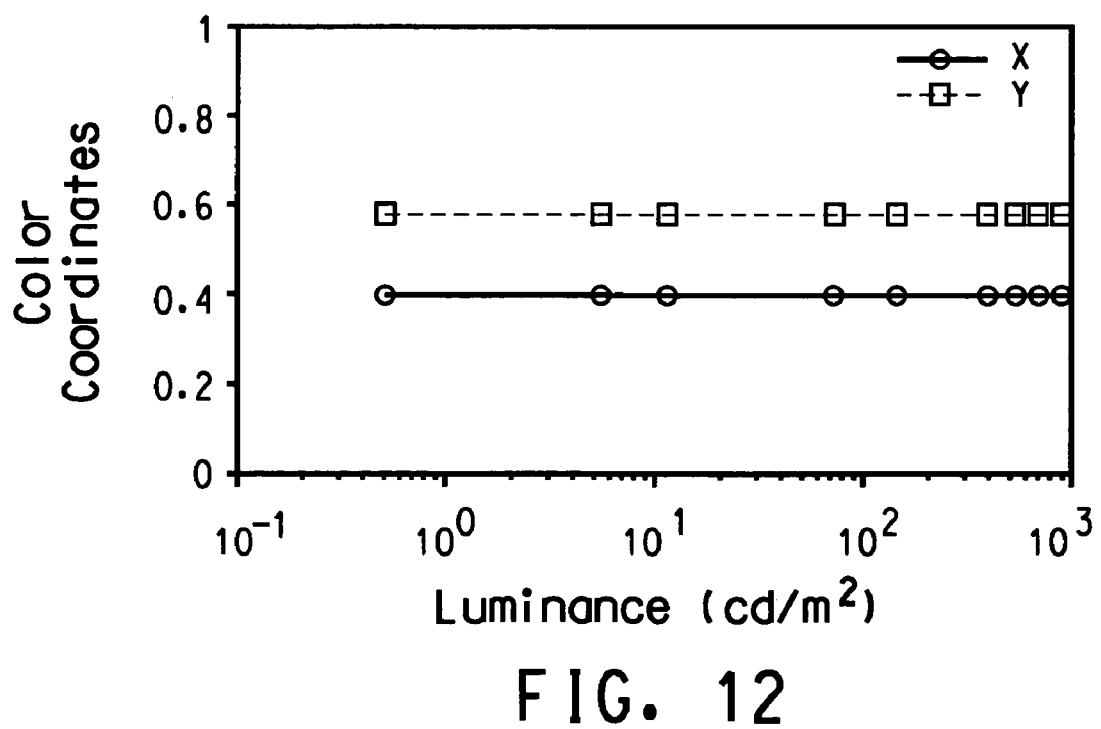
Figure 13:
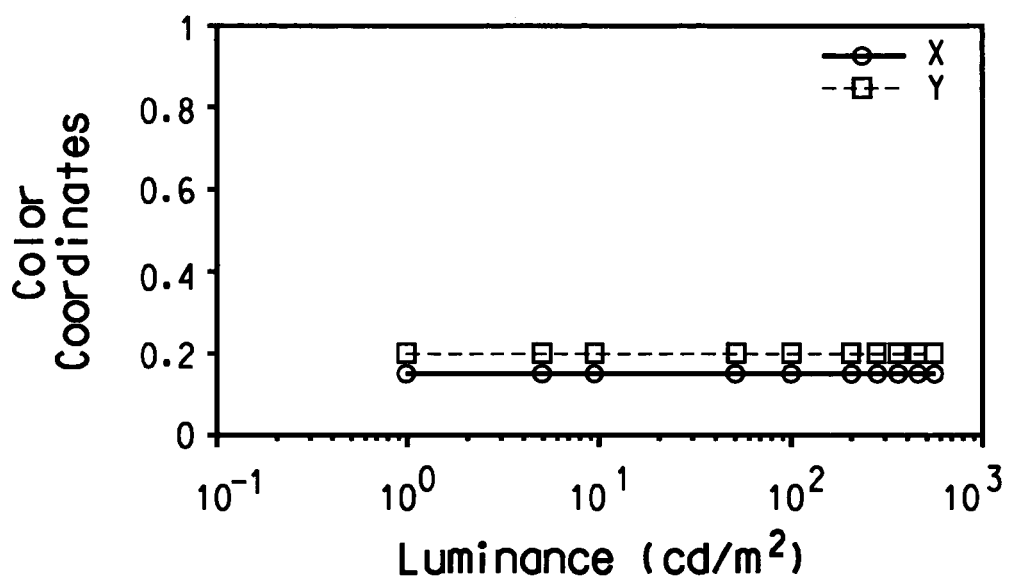
Figure 14:
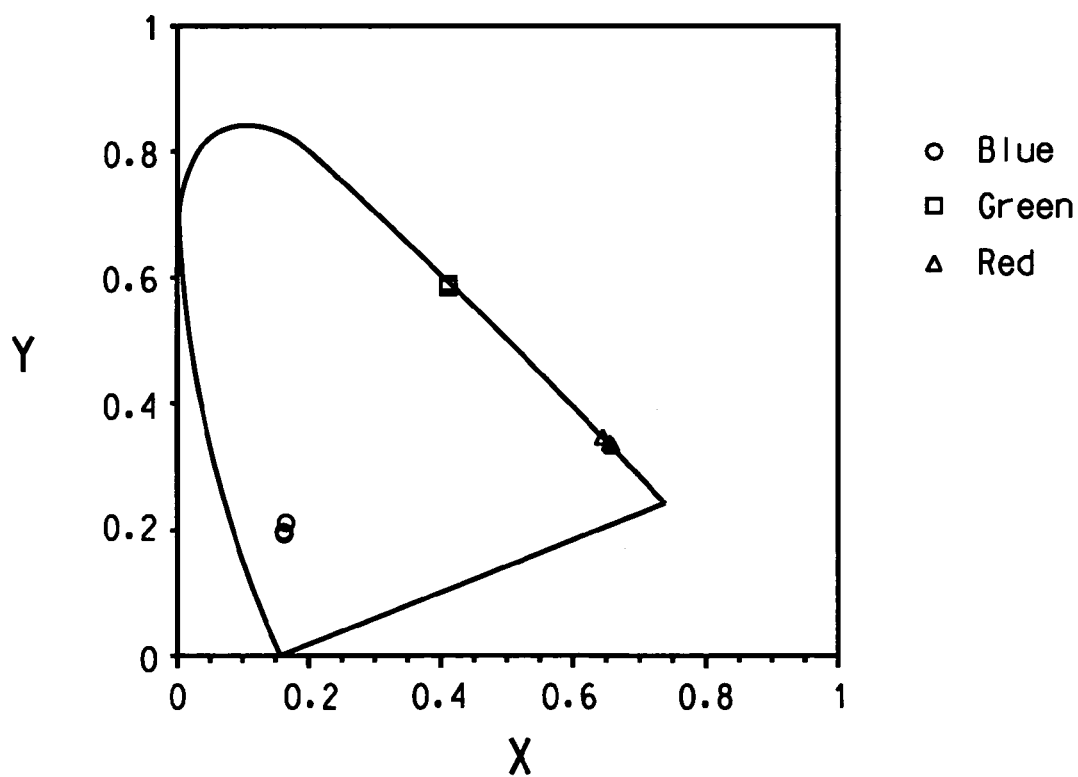
FIG. 14 illustrates the points from FIGS. 11 to 13 on a CIE1931 chromaticity chart.

Red-emitting, green-emitting, and blue-emitting components are prepared in a similar procedure as that described in Example 1. An organic active layer including a blue host material is spin coated to a thickness of approximately 40 nm. The red, green, and blue guest materials are added as previously described to give intermixed regions with thicknesses in a range of approximately 70 to 90 nm. Emission characteristics of a blue-emitting component is measured using a color analyzer (Chroma Model 71701) over a broad intensity range. The results are illustrated in FIGS. 11 to 13. The blue-emitting component has color coordinates at x of approximately 0.16 and y of approximately 0.20 in FIG. 13. The color remains stable over 3 orders of magnitude of emission intensity (e.g., luminance). The colors of the red-emitting and green-emitting components show similar color stability over 2 to 3 orders of intensity range (driving current changed over similar scales) in FIGS. 11 and 12, respectively. These results are also demonstrated in the CIE1931 chromaticity chart as illustrated in FIG. 14. The color stabilities of the green-emitting and red-emitting components, which have guest materials, are similar to that of the blue-emitting components, which is substantially free of guest materials.

These results also demonstrate that the green and red guest materials intermix with the organic active layer with relatively uniform concentration profiles. For current varying by 2 to 3 orders of magnitude and a device recombination zone in the intermixed organic active layer, the color coordinates (and thus the emission profile) remain constant, in contrast to the dramatic color changes observed by known processes.

The color stability over 2 to 3 orders of magnitude variation in current allows for a full-color display to be powered by controlling current (and thus intensity) with over 6 bits (64 levels), 8 bits (256 levels), or even 10 bits (1024 levels) gray levels for each color. In contrast, the gray scale control of color pixels in presently known devices is powered by other means (such as time domain) with a fixed emission peak intensity (to fix the color).

Note that not all of the activities described above in the general description or the examples are required, that a portion of a specific activity may not be required, and one or more that further activities may be performed in addition to those described. Still further, the order in which activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that one or more modifications or one or more other changes can be made without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more, problems, or any combination thereof has been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

What is claimed is:

1. A process for forming an electronic device comprising:
    forming a first layer over a substrate; and
    placing a first liquid composition over a first portion of the first layer, wherein the first liquid composition comprises at least a first guest material and a first liquid medium, wherein the first liquid composition comes in contact with the first layer and a substantial amount of the first guest material intermixes with the first layer to form an intermixed region where said contact occurs, wherein the intermixed region is thicker than the first layer as originally formed at the same location as the intermixed region wherein, the first layer is (1) capable of emitting radiation having an emission maximum at a targeted wavelength or within a targeted spectrum of wavelengths or (2) designed to respond to radiation at the targeted wavelength or within the targeted spectrum of wavelengths, wherein the targeted spectrum has a width no greater than 150 nm; and wherein the first guest material is (1) capable of emitting radiation having an emission maximum at a targeted wavelength or a targeted spectrum of wavelengths or (2) designed to respond to radiation at the targeted wavelength or within the targeted spectrum of wavelengths.

2. The process of claim 1, wherein each of the first layer and the first guest material has an emission maximum within a blue light spectrum.

3. The process of claim 1, further comprising:
    forming a second layer over the substrate before forming the first layer; and
    densifying at least part of the second layer,
    wherein the first layer is formed over the second layer after densifying.

4. The process of claim 3, wherein the first and second layers have substantially a same composition.

5. The process of claim 3, wherein the second layer substantially prevents the first guest material from intermixing with the substrate.

6. The process of claim 3, wherein densifying comprises cross-linking the second layer.

7. The process of claim 6, further comprising cross-linking the first layer, wherein:
    the first layer comprises a first material;
    the second layer comprises a second material;

cross-linking the first layer is performed such that some, but not all, of the first material is cross-linked; and cross-linking the second material is performed at least until substantially all of the second material is cross-linked.

8. The process of claim 1, further comprising:

placing a second liquid composition over a second portion of the first layer, wherein the second liquid composition comprises at least a second guest material and a second liquid medium, wherein:

the second guest material is different from the first guest material; and the second liquid composition comes in contact with the first layer and a substantial amount of the second guest material intermixes with the first layer to form an intermixed region where said contact occurs, wherein the intermixed region is thicker than the first layer as originally formed at the same location as the intermixed region; and placing a third liquid composition over a third portion of the first layer, wherein the third liquid composition comprises at least a third guest material and a third liquid medium, wherein:

the third guest material is different from each of the first and second guest materials; and the third liquid composition comes in contact with the first layer and a substantial amount of the third guest material intermixes with the first layer to form an intermixed region where said contact occurs, wherein the intermixed region is thicker than the first layer as originally formed at the same location as the intermixed region.

9. The process of claim 8, wherein:

the first layer, as formed, has a thickness no greater than 40 nm;

a first combination of the first layer and the first guest material has a thickness of at least 60 nm;

a second combination of the first layer and the second guest material has a thickness of at least 60 nm; and a third combination of the first layer and the third guest material has a thickness of at least 60 nm.

10. The process of claim 1, wherein substantially all of the first guest material intermixes with the first layer.

11. The process of claim 1, wherein forming the first layer comprises forming a continuous layer.

12. The process of claim 1 further comprising:

placing a second liquid composition over a second portion of the first layer, wherein the second liquid composition comprises at least a second guest material and a second liquid medium, wherein the second liquid composition comes in contact with the first layer and a substantial amount of the second guest material intermixes with the first layer to form an intermixed region where said contact occurs, wherein the intermixed region is thicker than the first layer as originally formed at the same location as the intermixed region;

the second guest material is (1) capable of emitting radiation having an emission maximum at the targeted wavelength or a targeted spectrum of wavelengths or (2) designed to respond to radiation at the targeted wavelength or within the targeted spectrum of wavelengths;

and the first and second guest materials comprise different materials.

13. The process of claim 1 wherein the first layer comprises a material capable of emitting blue light.

14. The process of claim 9 wherein the first, second and third combinations have thicknesses within 10 nm of each other.

15. The process of claim 1 wherein placing the first liquid composition over a first portion of the first layer is performed using a precision deposition technique.

* * * * *